(12) United States Patent
Hall, III et al.

(10) Patent No.: US 10,306,806 B2
(45) Date of Patent: May 28, 2019

(54) CAGE WITH AN ATTACHED HEATSINK

(71) Applicant: Samtec, Inc., New Albany, IN (US)

(72) Inventors: Thomas A. Hall, III, New Albany, IN (US); Kevin R. Meredith, New Albany, IN (US)

(73) Assignee: SAMTEC, INC., New Albany, IN (US)

( * ) Notice: Subject to any disclaimer, the term of this patent is extended or adjusted under 35 U.S.C. 154(b) by 0 days.

(21) Appl. No.: 15/866,967

(22) Filed: Jan. 10, 2018

(65) Prior Publication Data

US 2018/0199468 A1    Jul. 12, 2018

Related U.S. Application Data

(60) Provisional application No. 62/485,502, filed on Apr. 14, 2017, provisional application No. 62/445,449, filed on Jan. 12, 2017.

(51) Int. Cl.
*H05K 7/20* (2006.01)
*G02B 6/42* (2006.01)

(52) U.S. Cl.
CPC .......... *H05K 7/20418* (2013.01); *G02B 6/42* (2013.01); *H05K 7/2049* (2013.01)

(58) Field of Classification Search
CPC ......... H01L 2924/0002; H01L 2924/00; H01L 23/4093; H01L 23/4006; H01L 2924/3025; H01L 2023/405; H01L 23/40; H05K 7/20418; H05K 7/2039; H05K 9/0058; H05K 7/183; H05K 7/186; H05K 7/20154; H05K 7/20409; H05K 7/2049; H05K 2201/10121; H05K 9/0016; H05K 5/0286; G02B 6/4269; G02B 6/4261

USPC .......... 361/719, 715, 704, 709, 710, 679.46, 361/679.54, 702, 703; 165/80.3, 80.2, 165/104.33; 439/439, 607.23; 257/719, 257/E23.086, 718, E23.083, 706; 174/16.3, 252, 548, 160
See application file for complete search history.

(56) References Cited

U.S. PATENT DOCUMENTS

| | | |
|---|---|---|
| 4,345,267 A | 8/1982 | Corman et al. |
| 4,716,494 A | 12/1987 | Bright et al. |
| 5,313,099 A | 5/1994 | Tata et al. |
| 6,188,577 B1 | 2/2001 | Liu |
| 6,517,382 B2 | 2/2003 | Flickinger et al. |

(Continued)

OTHER PUBLICATIONS

Official Communication issued in Taiwanese Patent Application No. 107101260, dated Aug. 7, 2018.

(Continued)

*Primary Examiner* — Mandeep S Buttar
(74) *Attorney, Agent, or Firm* — Keating & Bennett, LLP

(57) ABSTRACT

A transceiver assembly includes a cage and a heatsink. The cage includes first and second spaced apart walls and a third wall that spans the first and second walls. The third wall defines an opening, and the third wall includes two spring arms that each extend into the opening. The heatsink includes a heatsink body including a first surface and a protrusion that extends from the first surface of the heatsink body and a pair of spring-arm receivers positioned on the first surface of the heatsink body. Each of the pair of spring-arm engagement portions is configured to engage with a corresponding one of the two spring arms of the cage when the heatsink is attached to the cage.

23 Claims, 51 Drawing Sheets

(56) References Cited

U.S. PATENT DOCUMENTS

| | | |
|---|---|---|
| 6,545,870 B1 | 4/2003 | Franke et al. |
| 6,683,796 B2 | 1/2004 | Radu et al. |
| 6,816,376 B2 | 11/2004 | Bright et al. |
| 6,950,310 B2 | 9/2005 | Edwards |
| 6,980,437 B2 | 12/2005 | Bright |
| 7,190,586 B2 | 3/2007 | Franz et al. |
| 7,237,349 B2* | 7/2007 | Huang .................... F16M 13/02 248/284.1 |
| 7,405,931 B2 | 7/2008 | Saturley et al. |
| 7,539,018 B2 | 5/2009 | Murr et al. |
| 7,573,709 B2 | 8/2009 | Gilliland et al. |
| 7,667,972 B2 | 2/2010 | Chen et al. |
| 8,081,470 B2 | 12/2011 | Oki et al. |
| 8,830,679 B2 | 9/2014 | Scholeno |
| 8,879,267 B2 | 11/2014 | Henry et al. |
| 9,052,483 B2 | 6/2015 | Nguyen |
| 2004/0027816 A1* | 2/2004 | Ice ....................... G02B 6/4201 361/797 |
| 2004/0257786 A1 | 12/2004 | Murasawa |
| 2010/0022113 A1 | 1/2010 | Ito |
| 2012/0168122 A1* | 7/2012 | Skepnek ............... H01L 23/367 165/80.2 |
| 2013/0323963 A1 | 12/2013 | Morrison et al. |
| 2014/0321061 A1 | 10/2014 | Moore et al. |
| 2015/0282382 A1 | 10/2015 | Nguyen |
| 2015/0296638 A1 | 10/2015 | Wu et al. |
| 2016/0174415 A1 | 6/2016 | Ito et al. |

OTHER PUBLICATIONS

Official Communication issued in International Patent Application No. PCT/US2018/013109, dated Apr. 30, 2018.

* cited by examiner

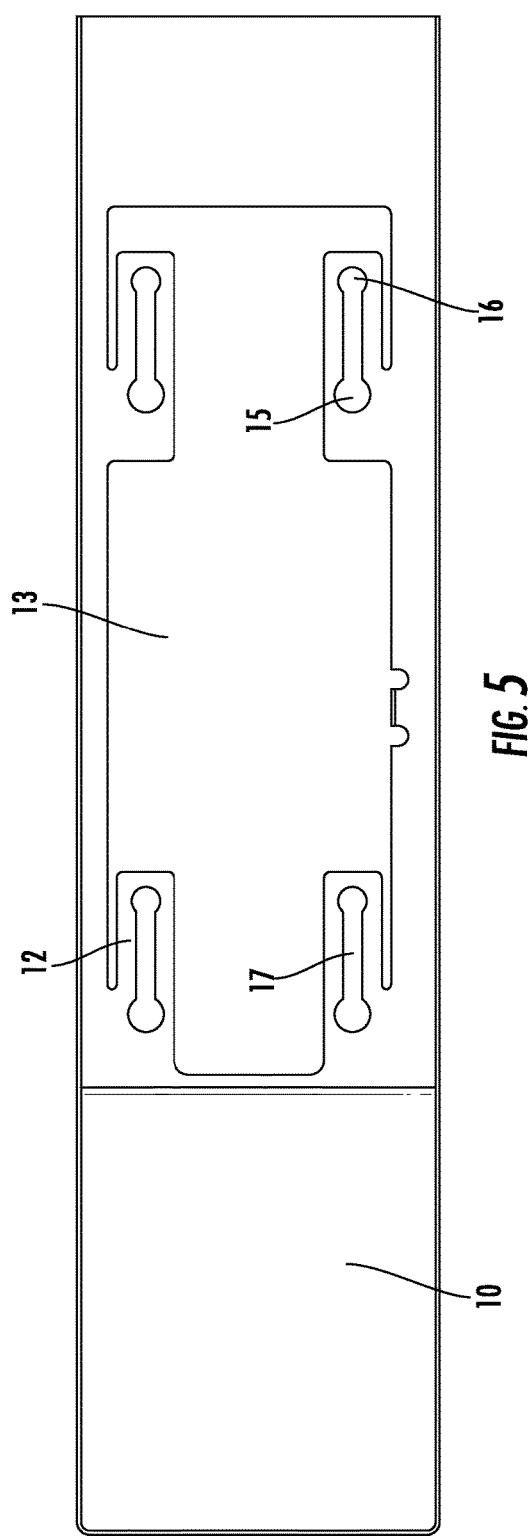
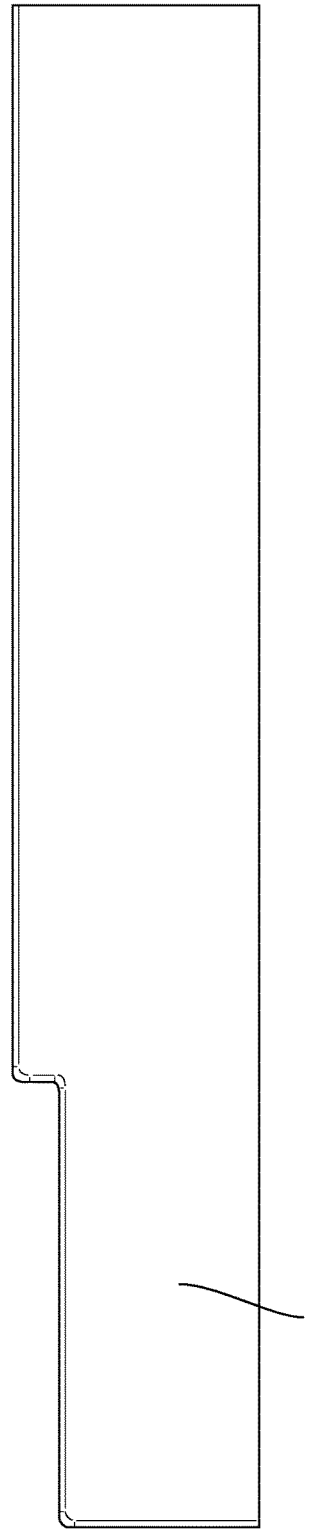
FIG. 5
FIG. 6

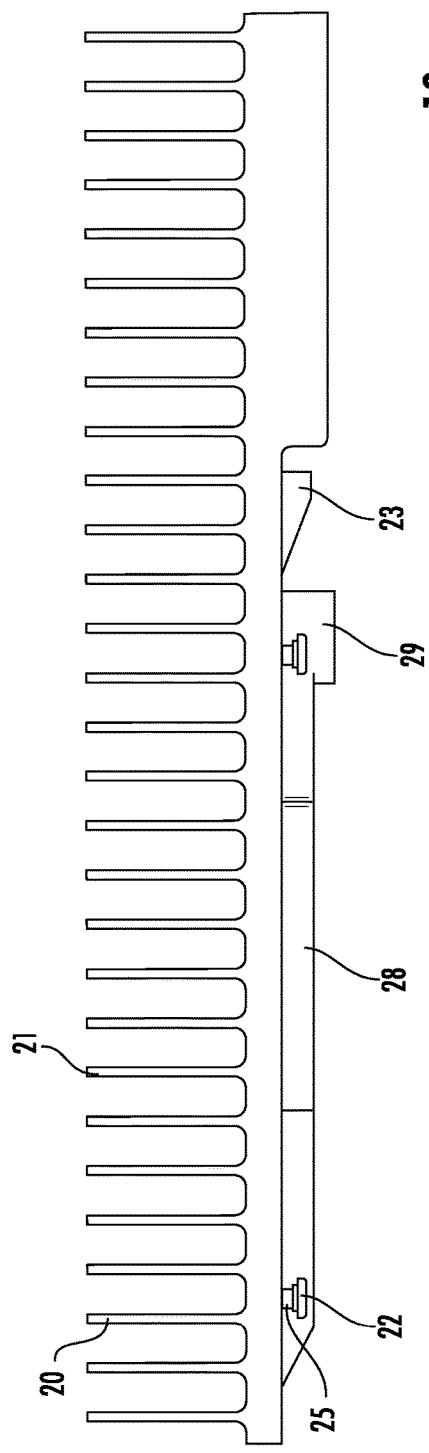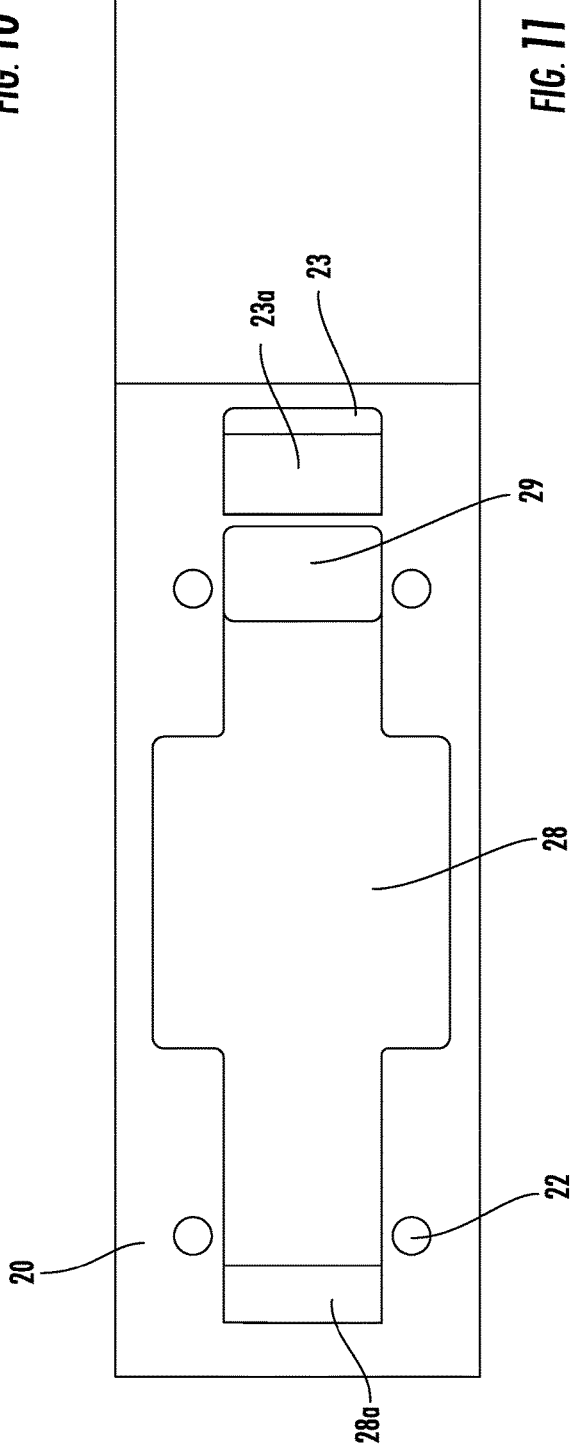

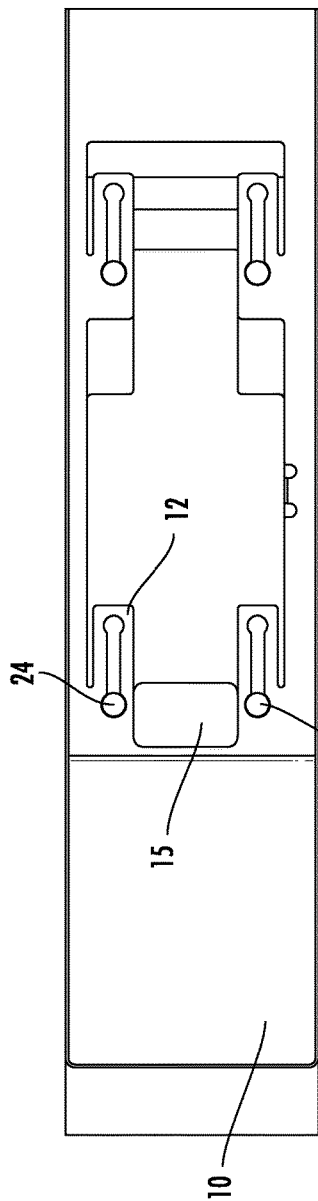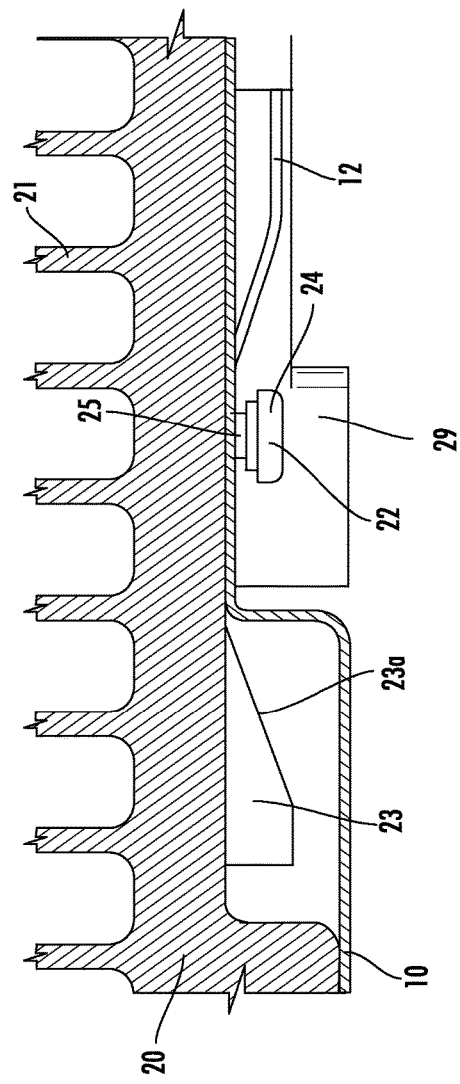
FIG. 15
FIG. 16

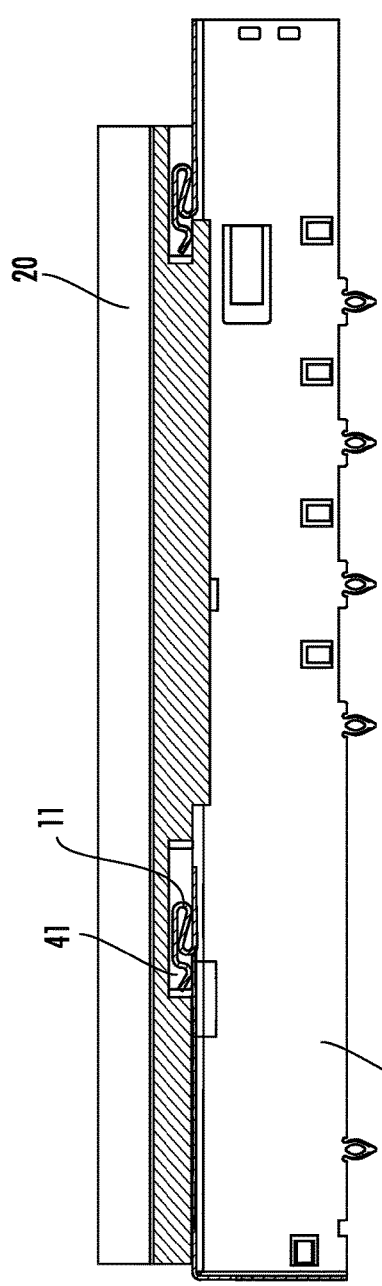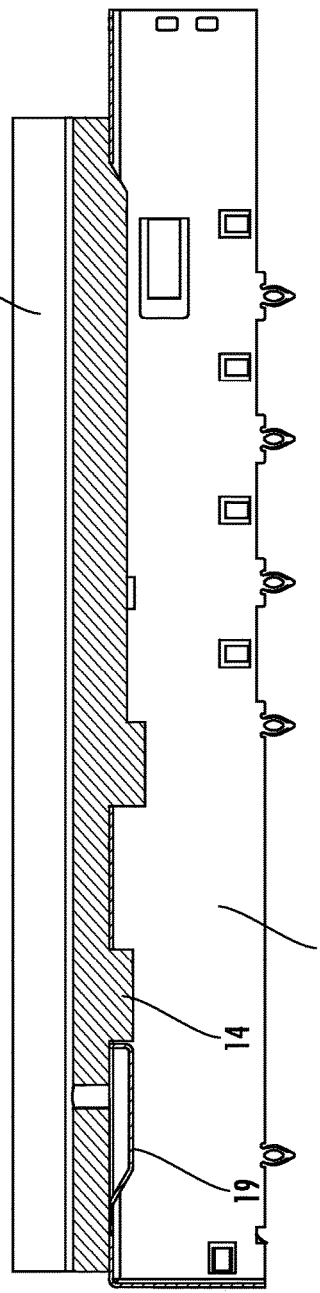

US 10,306,806 B2

CAGE WITH AN ATTACHED HEATSINK

BACKGROUND OF THE INVENTION

1. Field of the Invention

The present invention relates to cages for pluggable transceivers. More specifically, the present invention relates to such cages with an attached heatsink.

2. Description of the Related Art

When cages are stacked immediately adjacent to each other on a printed circuit board (PCB), it is known to use a separate spring clip to attach a heatsink to the cage. The spring clip is attached either to the rear of the cage or to the sidewalls of the cage that extend parallel to a transceiver insertion direction. When the spring clip is attached to the sidewalls, PCB density is decreased because two adjacent spring clips abut one another, creating space between adjacent cages. Eliminating cage-to-cage spacing can be done by a single spring clip that traverses all of the adjacent cages, but a different spring clip must be provided for each different array.

SUMMARY OF THE INVENTION

To overcome the problems described above, preferred embodiments of the present invention provide a cage that includes an integral biasing mechanism that pushes a heatsink against a transceiver and that eliminates the need for a separate biasing spring clip.

A cage according to a preferred embodiment of the present invention includes first and second spaced apart walls and a third wall that spans the first and second walls. The third wall includes an opening, and the third wall includes two spring arms that each extend into the opening.

The two spring arms are preferably each attached to the third wall and are cantilevered spring arms. The two spring arms and the opening preferably receive a portion of a heatsink. The cage further preferably includes a heatsink that includes a post, where one of the two spring arms includes a slot that receives the post. At least one of the two spring arms preferably includes a slot.

The cage further preferably includes a heatsink attached to the two spring arms. A protrusion defined by the heatsink preferably floats within the cage. The heatsink is preferably movable up and down within the cage, in directions toward and away from the third wall.

Preferably, the first wall includes a first edge and an opposed second edge, the second wall includes a third edge and an opposed fourth edge, and the third wall includes a fifth edge and an opposed sixth edge, the first wall and the second wall of the first and second spaced apart walls are parallel or substantially parallel to each other, the fifth edge of the third wall is attached to the first edge of the first wall and the opposed sixth edge of the third wall is attached to the third edge of the second wall, the opening is defined by the third wall, the two spring arms extend into the opening, and the opposed second edge of the first wall and the opposed fourth edge of the second wall are configured to be positioned adjacent to a mounting substrate.

The cage further preferably includes two additional spring arms. The two spring arms preferably extend from the third wall in a first direction.

A heatsink according to a preferred embodiment of the present invention includes a heatsink body including a first surface and a protrusion that extends from the first surface of the heatsink body and a pair of spring-arm receivers positioned on the first surface of the heatsink body. Each of the pair of spring-arm receivers is configured to engage with a corresponding one of two spring arms of a cage when the heatsink is attached to the cage.

The pair of spring-arm receivers are preferably spaced apart retention pins that each extend from the first surface of the heatsink body or are spaced apart pockets defined by the first surface of the heatsink body.

The heatsink further preferably includes an insertion key that is defined by the first surface of the heatsink body. The heatsink further preferably includes a retention key that is defined by the first surface of the heatsink body, where the retention key engages with the cage to prevent the heatsink from being unattached from the cage after the heatsink has been attached to the cage.

The heatsink further preferably includes an additional pair of spring-arm receivers. The pair of spring-arm receivers is a pair of pockets that each extend in a first direction.

A transceiver assembly according to a preferred embodiment of the present invention includes a cage and a heatsink. The cage includes first and second spaced apart walls and a third wall that spans the first and second walls. The third wall defines an opening, and the third wall includes two spring arms that each extend into the opening. The heatsink includes a heatsink body including a first surface and a protrusion that extends from the first surface of the heatsink body and a pair of spring-arm receivers positioned on the first surface of the heatsink body. Each of the pair of spring-arm engagement portions is configured to engage with a corresponding one of the two spring arms of the cage when the heatsink is attached to the cage.

The transceiver assembly further preferably includes a transceiver plugged into the cage such that the transceiver engages the protrusion. Preferably, the heat sink body further includes a second surface, opposite the first surface, and the cage and the heatsink are devoid of any spring that exerts a force on the second surface of the heatsink body. The third wall of the cage preferably does not flex when a transceiver is positioned between the first and second spaced apart walls of the cage.

Preferably, the cage further includes two additional spring arms, and the heatsink further includes an additional pair of spring-arm receivers. Preferably, the two spring arms extend from the third wall in a first direction, and the pair of spring-arm receivers is a pair of pockets that each extend in the first direction.

The above and other features, elements, characteristics, steps, and advantages of the present invention will become more apparent from the following detailed description of preferred embodiments of the present invention with reference to the attached drawings.

BRIEF DESCRIPTION OF THE DRAWINGS

FIG. 5 is a top view of the cage of FIG. 1.

FIG. 6 is a side view of the cage of FIG. 1.

FIG. 10 is a side view of the heatsink of FIG. 1.

FIG. 11 is a bottom view of the heatsink of FIG. 1.

FIGS. 12-18 show a first step in attaching the heatsink to the cage of FIG. 1.

FIGS. 30 and 31 are sectional side views of the cage with the heatsink of FIG. 29.

DETAILED DESCRIPTION OF PREFERRED EMBODIMENTS

Figure 1:
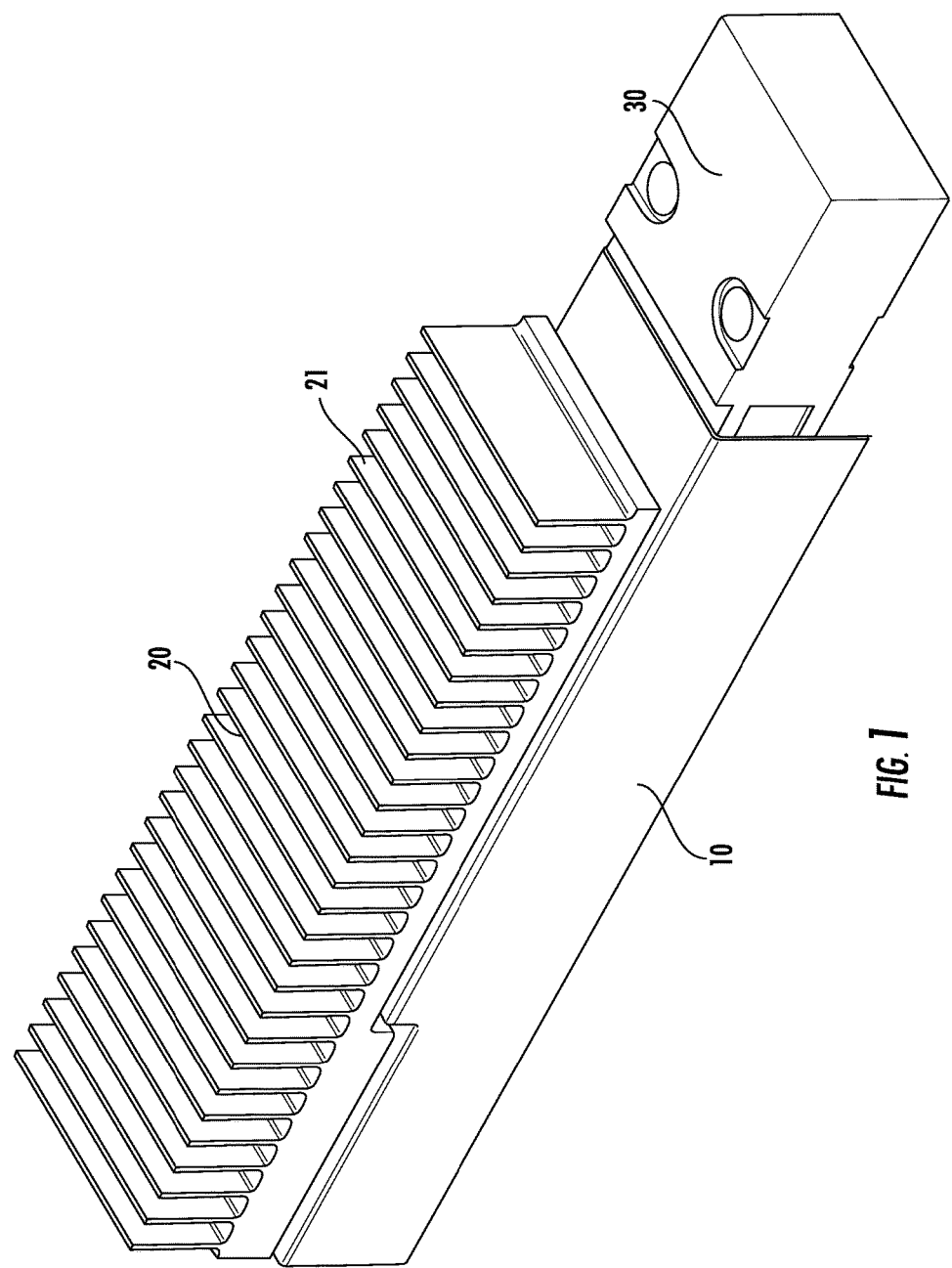
FIGS. 1 and 2 show a cage with a heatsink according to a first preferred embodiment of the present invention with a transceiver plugged into the cage.
Figure 2:
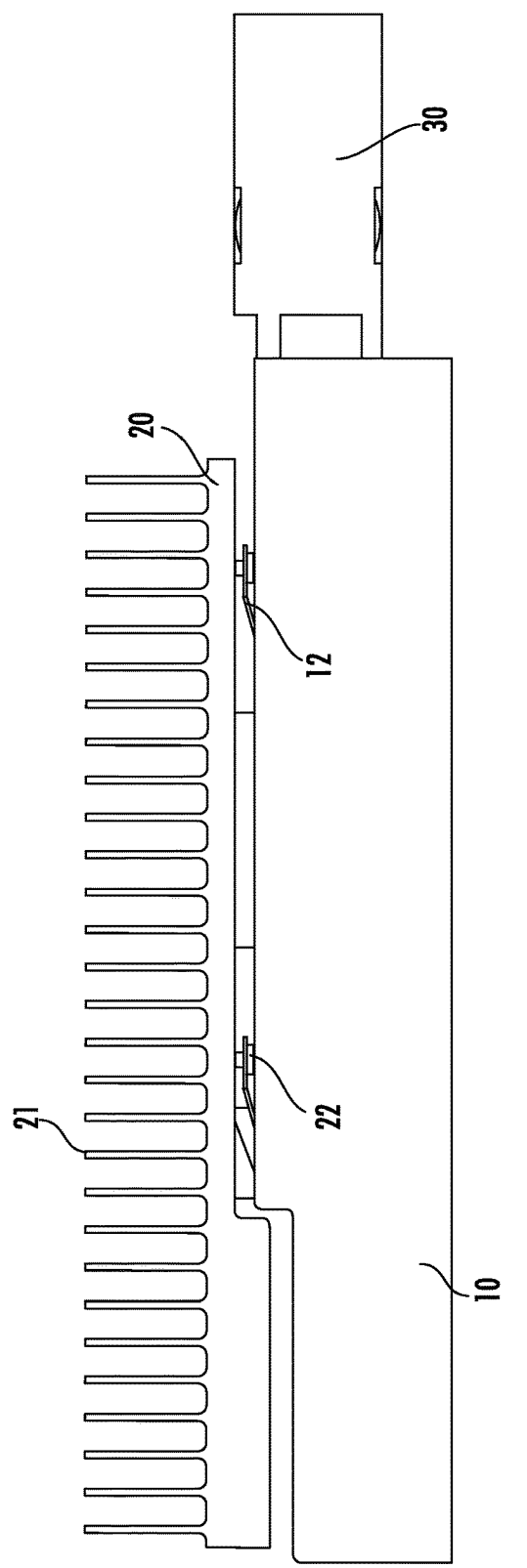
Figure 29:
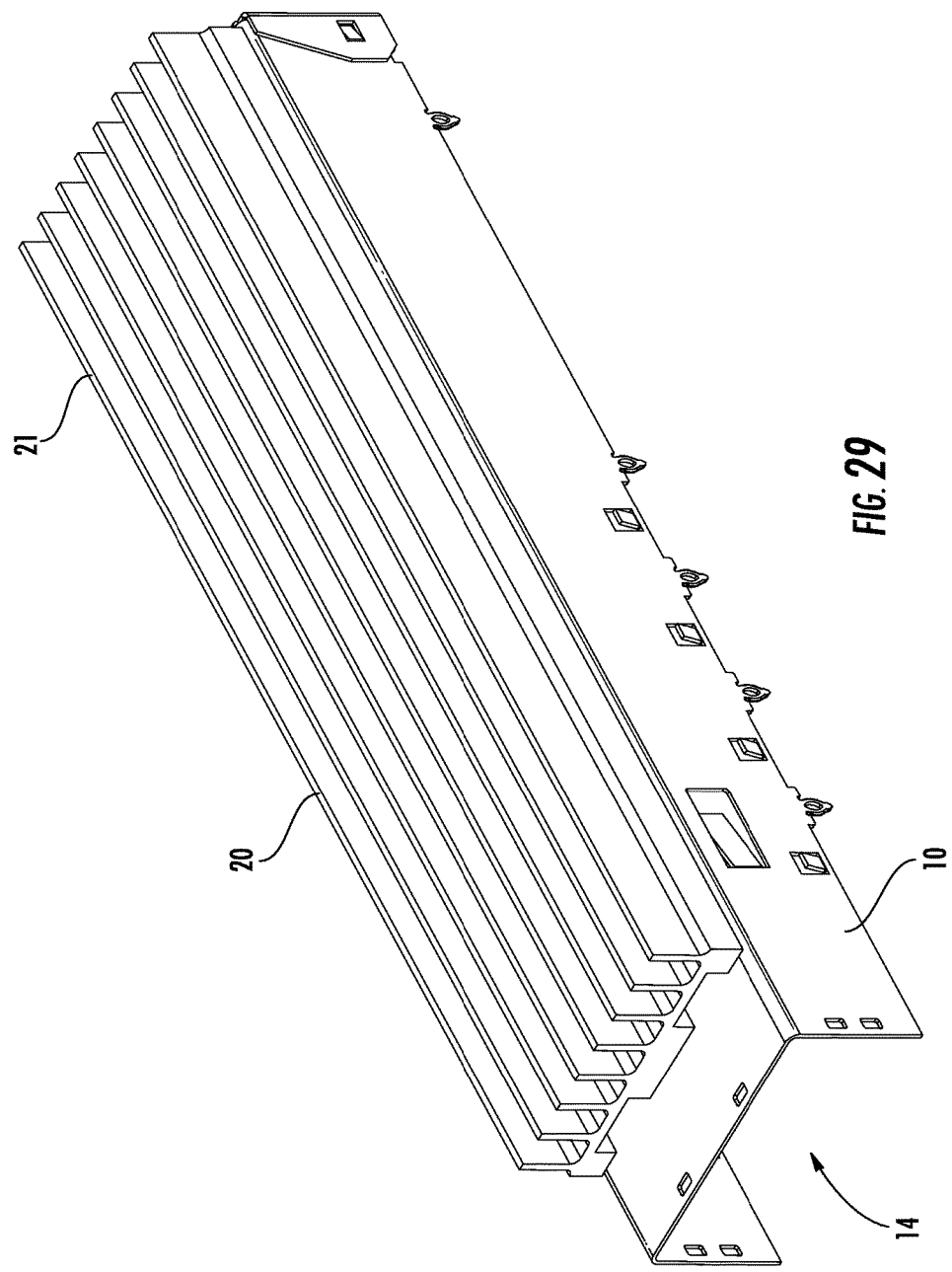
FIG. 29 is perspective view of a cage with a heatsink according to a second preferred embodiment of the present invention.

FIGS. 1 and 2 show a transceiver 30 plugged into a cage 10 with an attached heatsink 20 according to a first preferred embodiment of the present invention, and FIGS. 29 and 30 show a cage 10 with an attached heatsink 20 according to a second preferred embodiment of the present invention.

Although a transceiver 30 is not shown in FIGS. 29 and 30, a transceiver 30 can also be plugged into the cage 10 of the second preferred embodiment of the present invention. The transceiver 30 can include any suitable transceiver, including, for example, a transceiver suitable for QSFP+, CXP, or SFP+ standards. The transceiver 30 can be electrical and/or optical. Although the transceiver 30 typically transmits and receives signals, the transceiver 30 can only transmit signals or can only receive signals.

The cages 10 of the preferred embodiments are preferably made of stamped metal but other suitable materials could also be used and can include spring arms. The spring arms can transmit a force on the heatsink 20, can restrain the movement of the heatsink 20 in at least one direction in a plane defined by the opening 13, and can allow the heatsink 20 to move in a direction perpendicular or substantially perpendicular to the plane defined by the opening 13. Examples of spring arms include arms 12 of the first preferred embodiment and springs 11 of the second preferred embodiment. The spring arms can extend into an opening 13 of the cage 10 and can extend into the cage 10, i.e., extend below a plane defined by the opening 13. The spring arms can extend from the cage 10 in the same general first direction to allow the heatsink 20 to slide onto the cage 10 in direction opposite to the first direction to attach the heatsink 20 to the cage 10. Once the heatsink 20 is attached to the cage 10, the spring arms, in the plane defined by the opening 13, either can prevent movement of the heatsink 20 in any direction or can prevent movement of the heatsink 20 except for in the first direction. The heatsink 20 can be releasably attached to the cage 10 if the spring arms allow the heatsink 20 to be moved in the first direction. For example, the heatsink 20 can be disengaged from the cage 10 by sliding the heatsink in the first direction.

Figure 56:
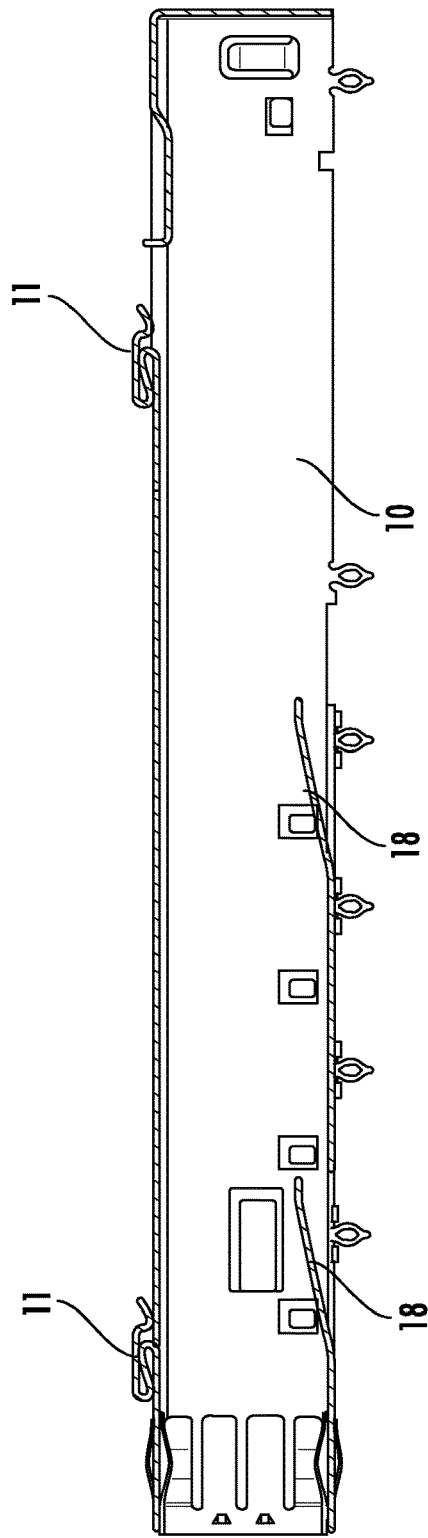
FIG. 56 is a sectional side view of a cage according to a preferred embodiment of the present invention.

Arms 12 or springs 11 are preferably stamped and formed when the cage 10 is manufactured such that the cage 10 and the arms 12 or the cage 10 and the springs 11 define a monolithic body, i.e., define a single unitary structure. Other possible arrangements for the spring arms are also possible. For example, cages 10 could be stamped and then the spring arms could be added to the cage 10. Different cages 10 can be used for transceivers 30 of different standards. Within a single standard, the cage 10 can accept transceivers of different heights. For example, the cage 10 might accept QSFP+ transceivers of different heights. Different heights in the transceivers 30 can be caused by manufacturing tolerances or by deliberate design decisions. Each of the cages 10 of the preferred embodiments of the present invention includes first and second walls connected by a third wall that includes an opening 13 that can receive a portion of the heatsink 30. As shown in FIG. 56, the cage 10 can include a fourth rear wall and a fifth wall, opposite to the third wall. Springs 18 can extend from the fifth wall to push a transceiver 30 toward the third wall when a transceiver 30 is inserted into the cage 10. Any number of springs 18 can extend from the fifth wall. The springs 18 on the fifth wall can have a similar spring force over a similar deflection range as the cantilevered arms 12 on the third wall of the first preferred embodiment of the present invention or the springs 11 on the third wall of the second preferred embodiment of the present invention.

Figure 68:
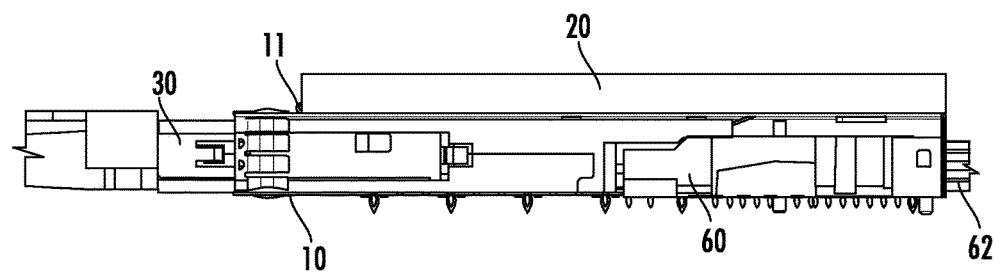
FIGS. 68 and 69 are sectional side views of the cage and the electrical connector of FIG. 67.
Figure 69:
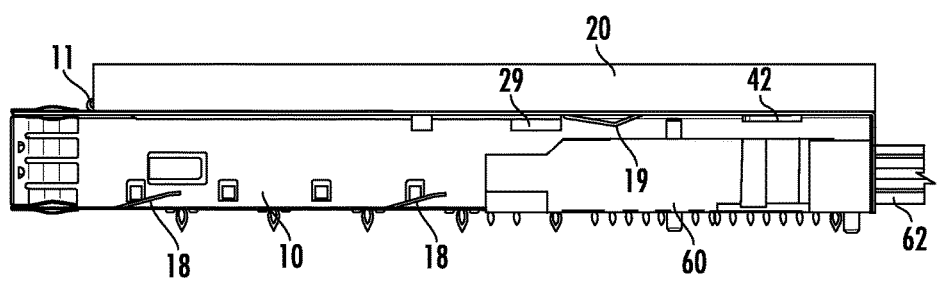

The spring arms, e.g., the springs 11 and arms 12, press against the heatsink 20 such that the heatsink 20 is automatically biased against the transceiver 30 when the transceiver 30 is inserted into the cage 10. External forces do not need to be applied to the cage 10 or heatsink 20 to ensure that the heatsink 20 engages with the transceiver 30. FIGS. 68 and 69 show the cage 10 and an electrical connector 60. FIG. 68 shows the transceiver 30 inserted into the cage 10, and FIG. 69 shows the cage 10 without the transceiver 30. In FIGS. 68 and 69, the springs 11 push the heatsink 20 towards the bottom of the cage 10, which results in the transceiver 30 being pushed towards the bottom of the cage 10, and the springs 18 push the transceiver 30 towards the top of the cage 10. The similar spring forces allow the transceiver PCB to align with the opening of a connector in the cage, irrespective of the transceiver size, and the similar spring forces reduce asymmetric loading forces of the transceiver PCB on the contacts within the electrical connector 60, which reduces or eliminates excessive force on the lower rows of contacts, thus improving the wear characteristics of the electrical connector 60. Because the arms 12 and the springs 11 engage with the surface of the heatsink 20 that contacts the transceiver 30, i.e., the bottom surface of the heatsink 20, there is no need for a spring or strap that engages with the top, side, or rear surfaces of the heatsink 20.

Although any size opening(s) 13 can be used in the cages according to the preferred embodiments of the present invention, larger openings allow the area of direct contact between the heatsink 20 and the transceiver 30 to be larger. In applications in which heat is only generated in a localized area of the transceiver 30, it is possible to have a single, smaller opening that includes the localized heat-generating area. As shown, for example, in FIGS. 3 and 32, the opening(s) 13 in the cage 10 are typically bounded, i.e., completely enclosed, and are defined by four sides. But other opening arrangements are also possible. The opening 13 can be unbounded, i.e., not completely enclosed, or can be defined by two, three, or more than four sides. For example, the opening can be a bounded triangle with three sides or can be unbounded V-shape located along an edge of the cage 10 such that the opening 13 is not completely enclosed and such that the V-shape is defined by only two sides.

Figure 8:
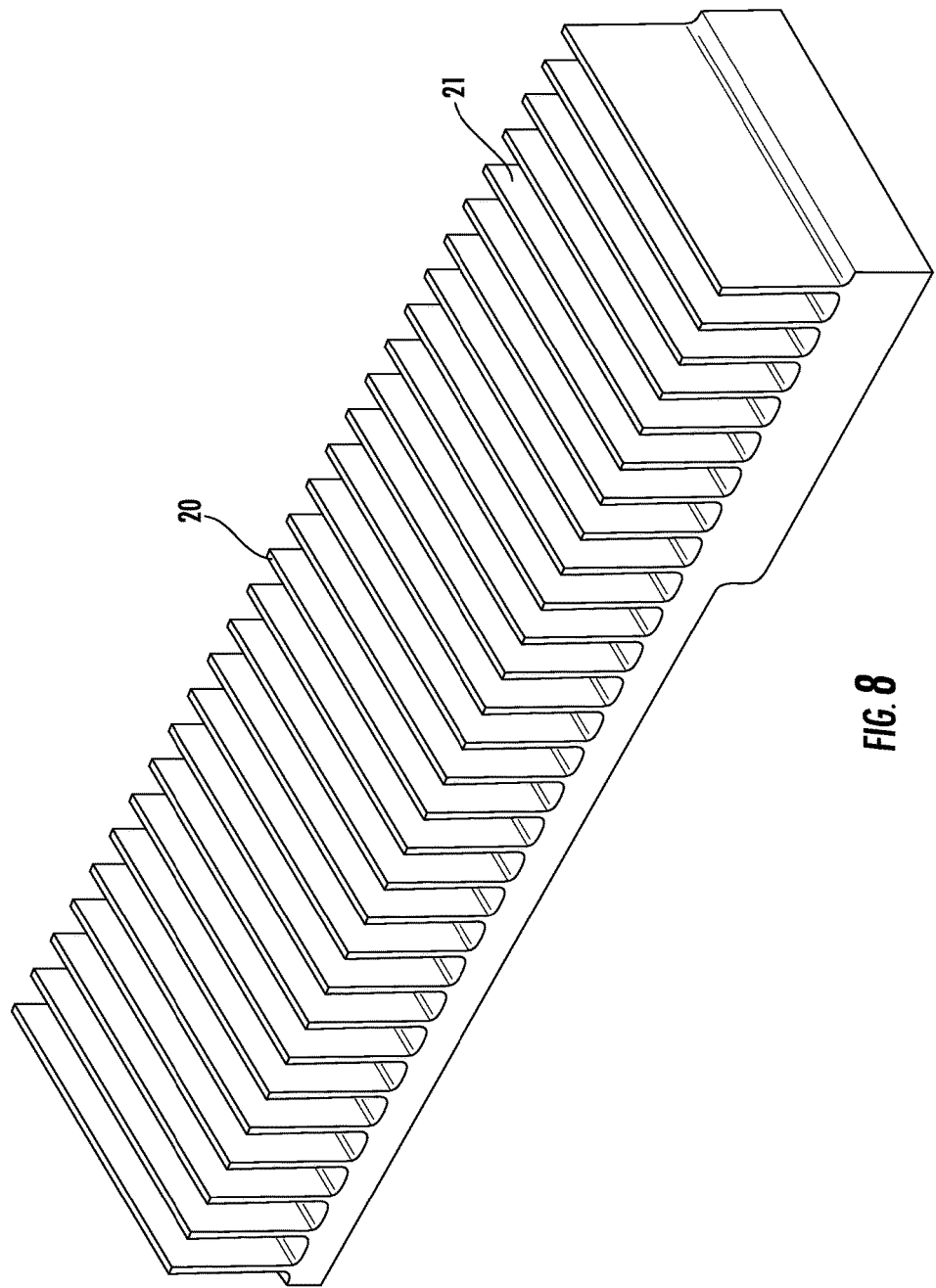
FIGS. 8 and 9 are perspective views of the heatsink of FIG. 1.

The heatsinks 20 of the preferred embodiments of the present invention are preferably made of a heat-conducting material, including for example, a metal. The heatsinks 20 can have any suitable shape, including, for example, a generally rectangular shape as shown, for example, in FIGS. 8 and 38. In some applications in which the cage length that extends in the transceiver-insertion direction is longer than the cage width that is perpendicular or substantially perpendicular to the transceiver-insertion direction, the heatsink 20 preferably does not have a circular or generally circular shape. The heatsinks 20 include spring-arm receivers that engage with the springs arms of the cage 10. In the first preferred embodiment, the spring-arm receivers are retention pins 22 or 26 that engage with the arms 12, and in the second preferred embodiment, the spring-arm receivers are pockets 41 that engage with the springs 11. If the spring-arm receivers are pockets 41, then the spring-arm receivers can each extend in a first direction to allow the heatsink 20 to slide with respect to the cage 10 when the heatsink 20 is attached to the cage 10.

Figure 52:
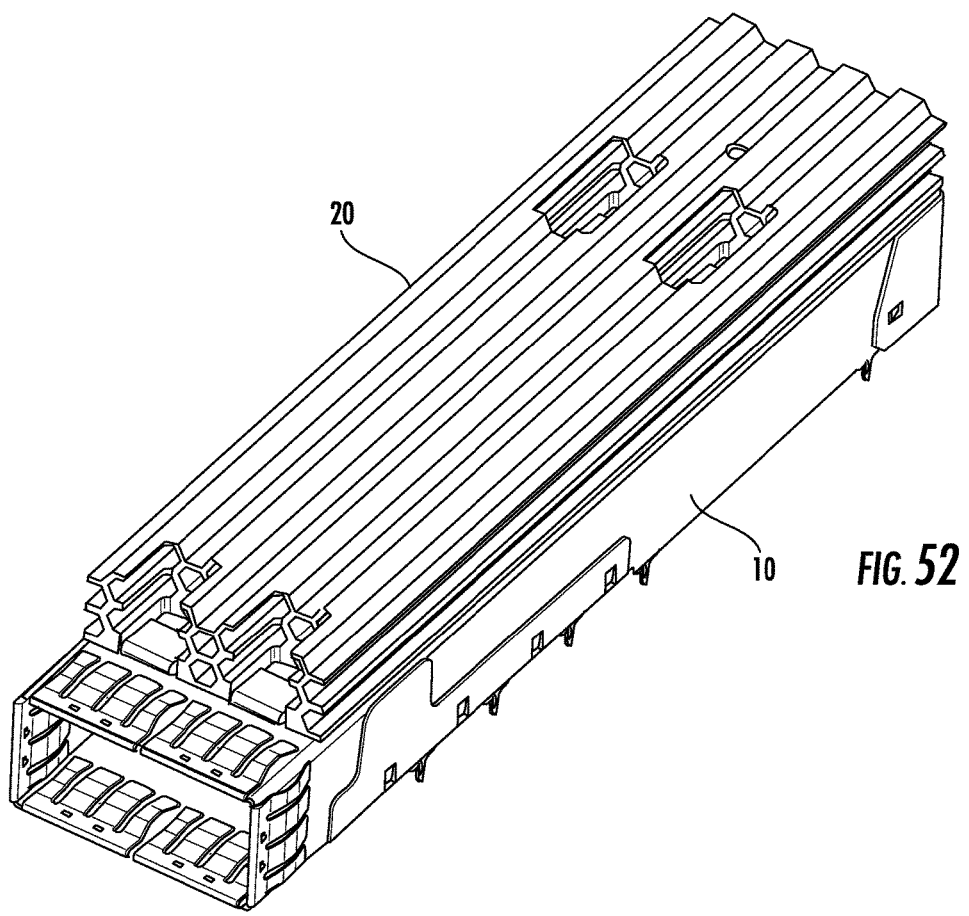
FIGS. 52-55 are perspective views of cages with different heatsinks according to preferred embodiments of the present invention.
Figure 53:
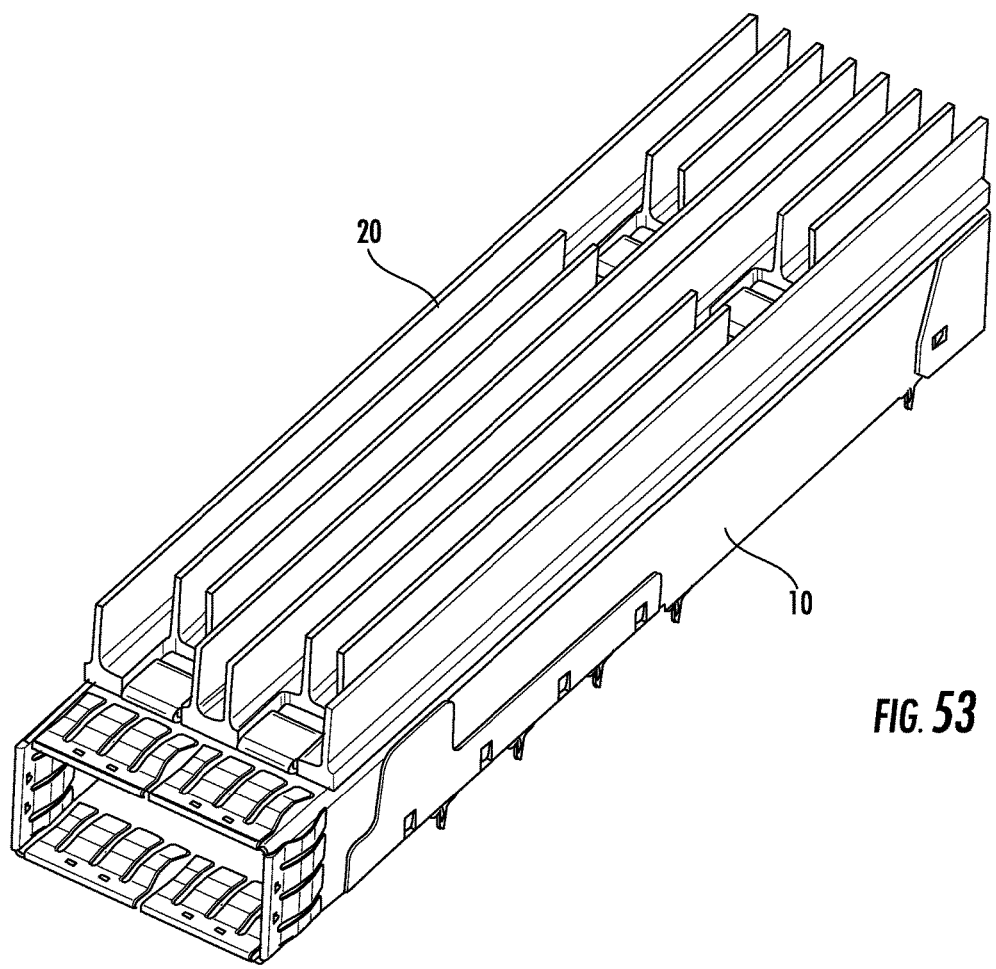
Figure 54:
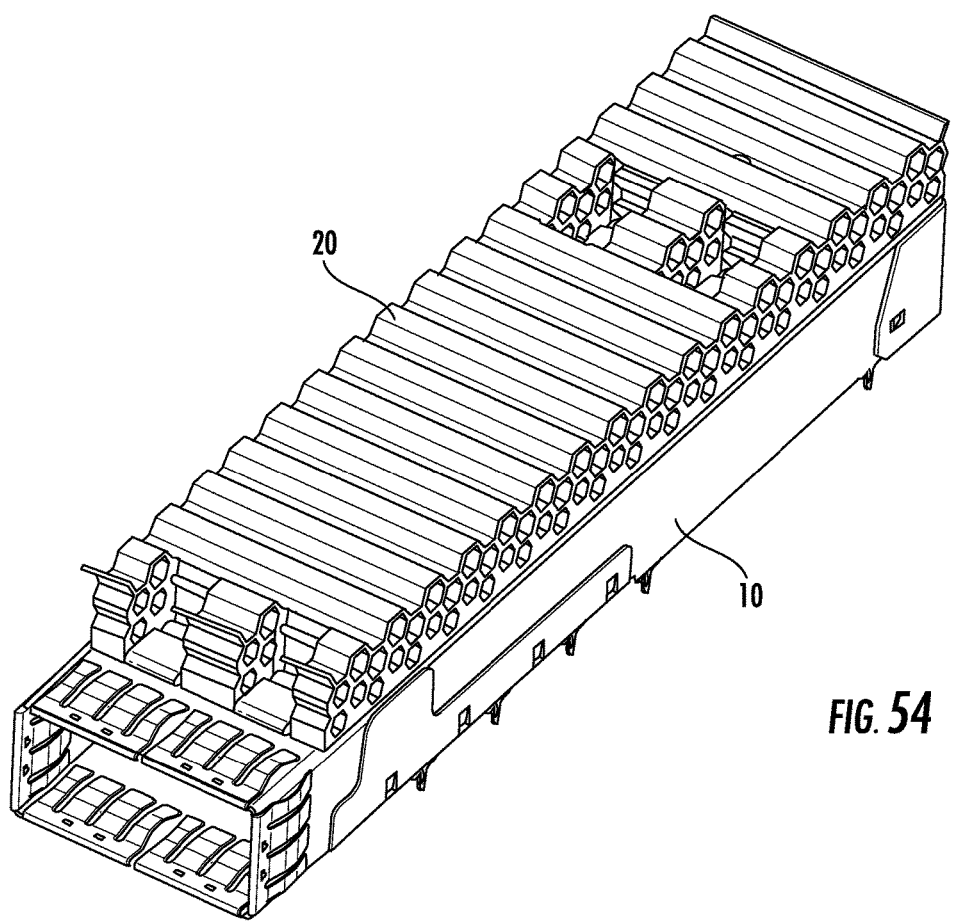
Figure 55:
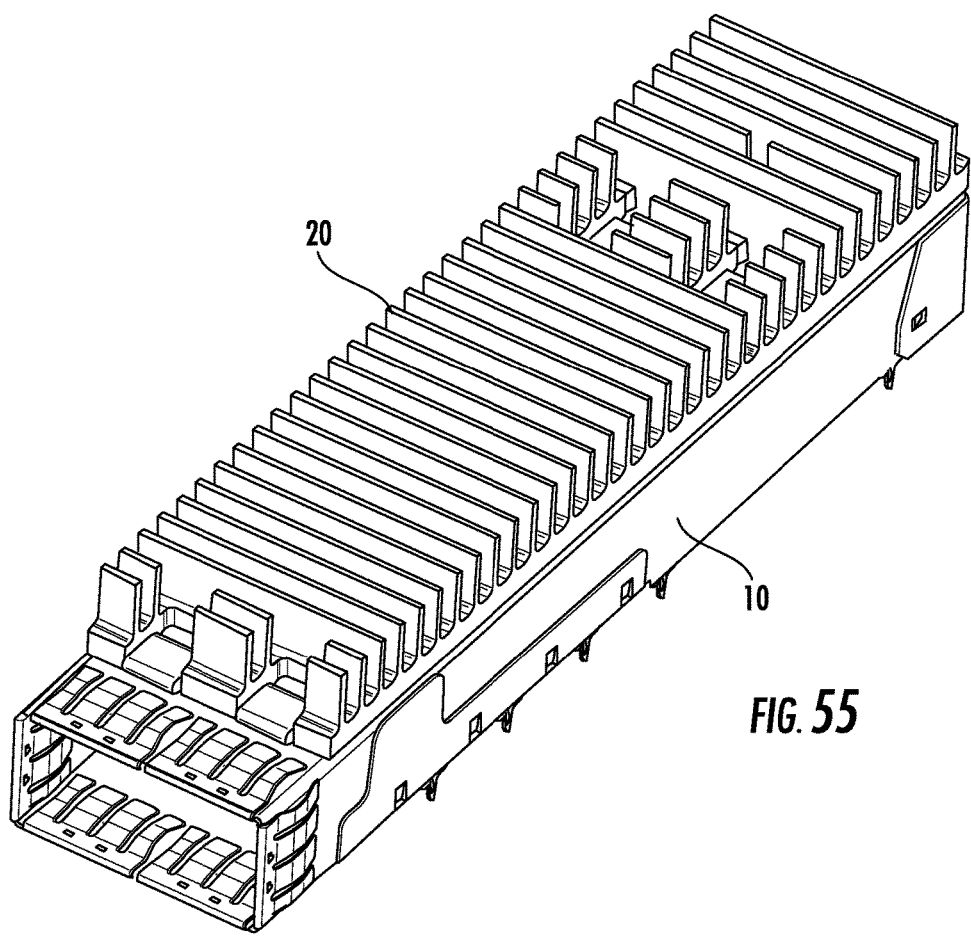
Figure 66:
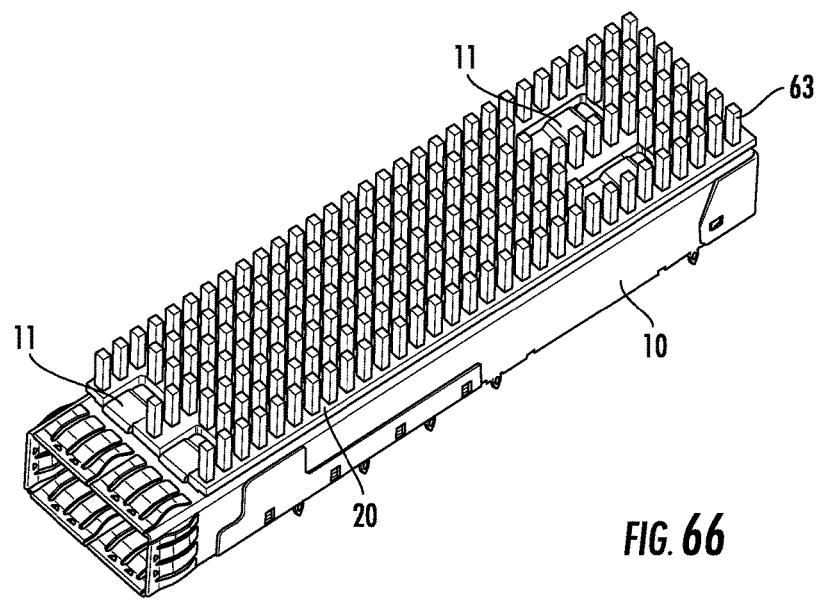
FIG. 66 is perspective view of a cage with an attached heatsink according to a preferred embodiment of the present invention.

As shown in FIGS. 1, 29, 53, and 55, the heatsink 20 can include fins 21 that extend perpendicular or substantially perpendicular (within manufacturing tolerances) to the transceiver insertion direction or that extend parallel or substantially parallel (within manufacturing tolerances) to the transceiver insertion direction. The fins 21 can be oriented in other directions as well. Any number of fins 21 can be used. Heat-dissipating structures other than the fins 21 can be used. For example, heat-dissipating pins or columns 63 could be used, either instead of, or in addition to, the fins 21, as shown, for example, in FIG. 66. Instead of the fins 21, as shown in FIG. 52, the heatsink 20 can include air flow paths that extend parallel or substantially parallel (within manufacturing tolerances) to the transceiver insertion direction of the cage 10 as disclosed in U.S. application Ser. No. 15/261,295, which is hereby incorporated by reference in its entirety. These air flow paths can include hexagonal cross-sections, as shown, for example in FIG. 3 of U.S. application Ser. No. 15/261,295, or any other suitable cross-sectional shape. As shown in FIG. 54, it is also possible that the air flow paths extend perpendicular or substantially perpendicular (within manufacturing tolerances) to the transceiver insertion direction. The air flow paths in the heatsink 20 are preferably arranged such that, when the cages 10 with the heatsinks 20 are arranged in an array as shown, for example, FIGS. 24 and 25, the air flow paths extend between the front and the back of the cage array or extend between the sides of the cage array. As disclosed in U.S. application Ser. No. 15/261,295, a blower can be used to force air through the air flow paths to increase cooling.

Figure 61:
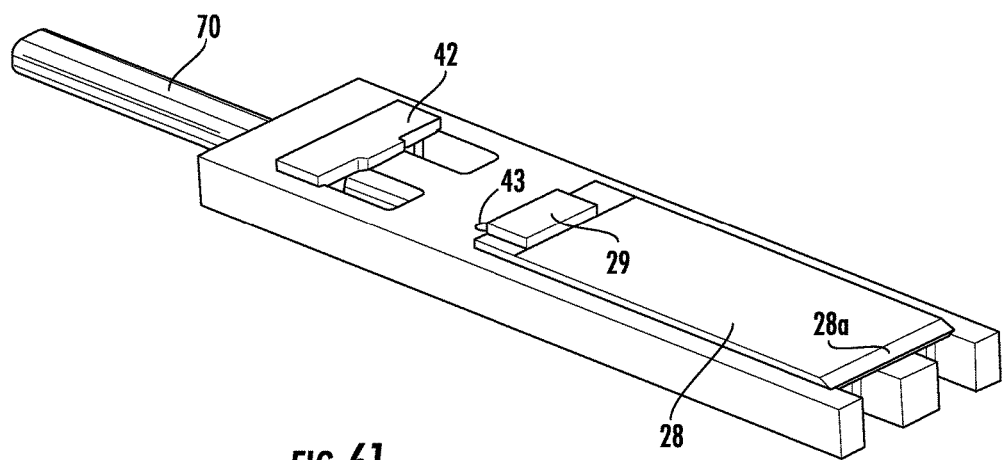
Figure 62:
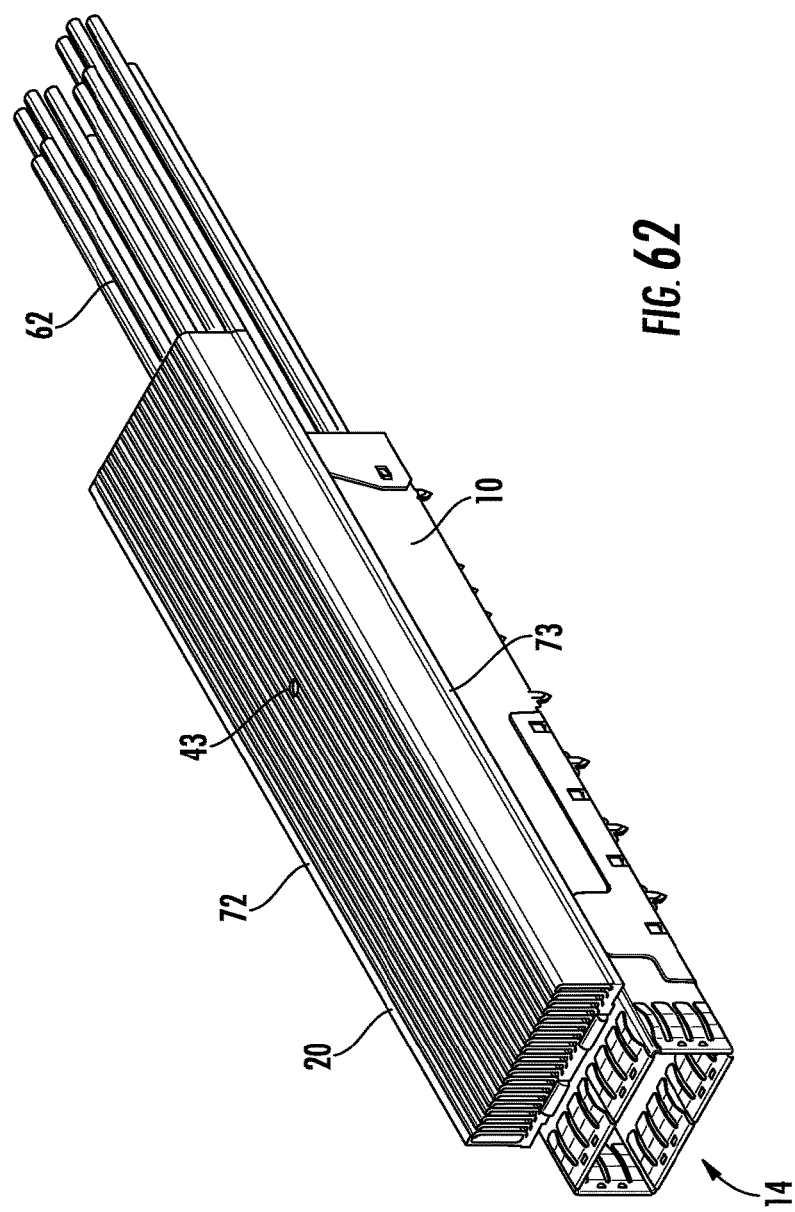
FIGS. 62 and 63 are a perspective view and a front view of cage with an attached heatsink according to a preferred embodiment of the present invention.
Figure 63:
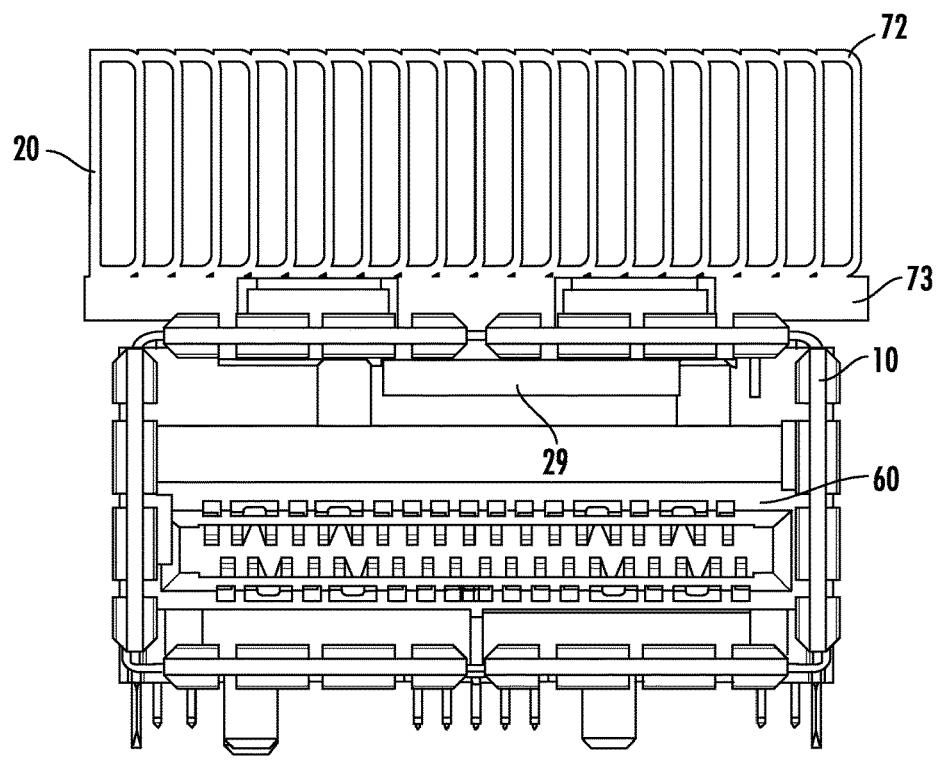
Figure 64:
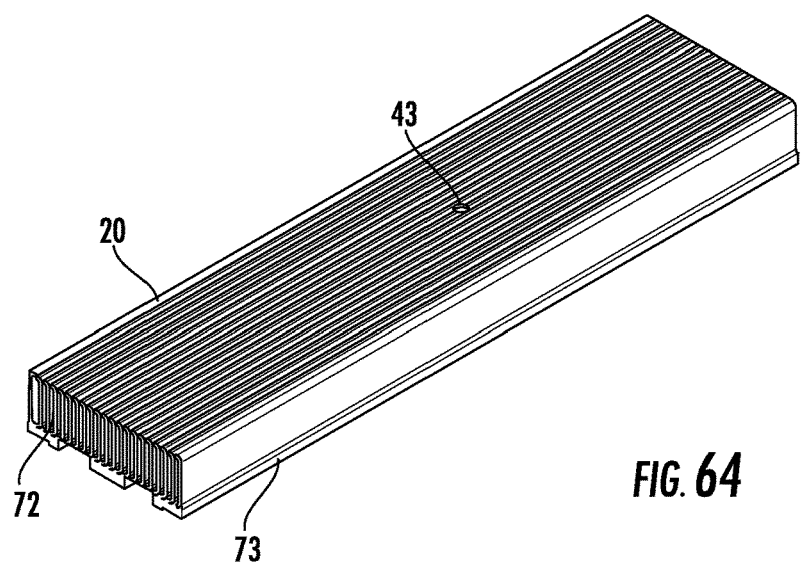
FIGS. 64 and 65 are perspective views of the heatsink of FIG. 62.
Figure 65:
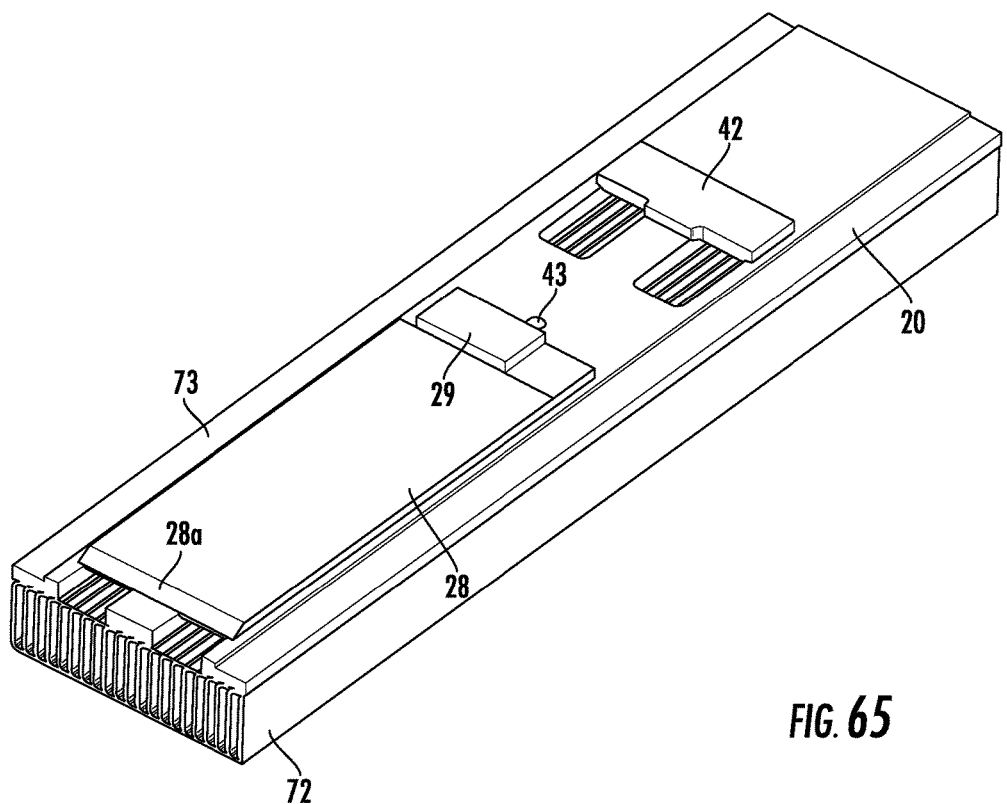

As shown in FIGS. 62-65, a heatsink 20 with a zippered structure 72 and a base 73 can be used. The zippered structure 72 can be attached to the base 73 in any suitable manner, including, for example, soldering or bonding. As shown in FIGS. 64 and 65, the heatsink 20 can include a hole 43 through which a tool can be used to disengage the retention latch 19. If the heatsink 20 of FIGS. 64 and 65 is used with the cage 10 of the first preferred embodiment, then a hole 43 is not needed. The zippered structure 72 provides a high density structure for heat dissipation. The zippered structure 72 can be made by joining together individually stamped fins. Because the fins are individually stamped, the fins can have any suitable shape and can include other stamped features. The zippered structure 72 can be also can be used with the heat pipe 70 of FIGS. 60 and 61. As shown in FIGS. 62 and 63, the widths of the zippered structure 72 and the base 73 can be greater than the width of the cage 10, which increases the heat dissipation of the heatsink 20 compared to a structure in which the widths are the same, but this increases the required PCB area for the cages 10.

Figure 67:
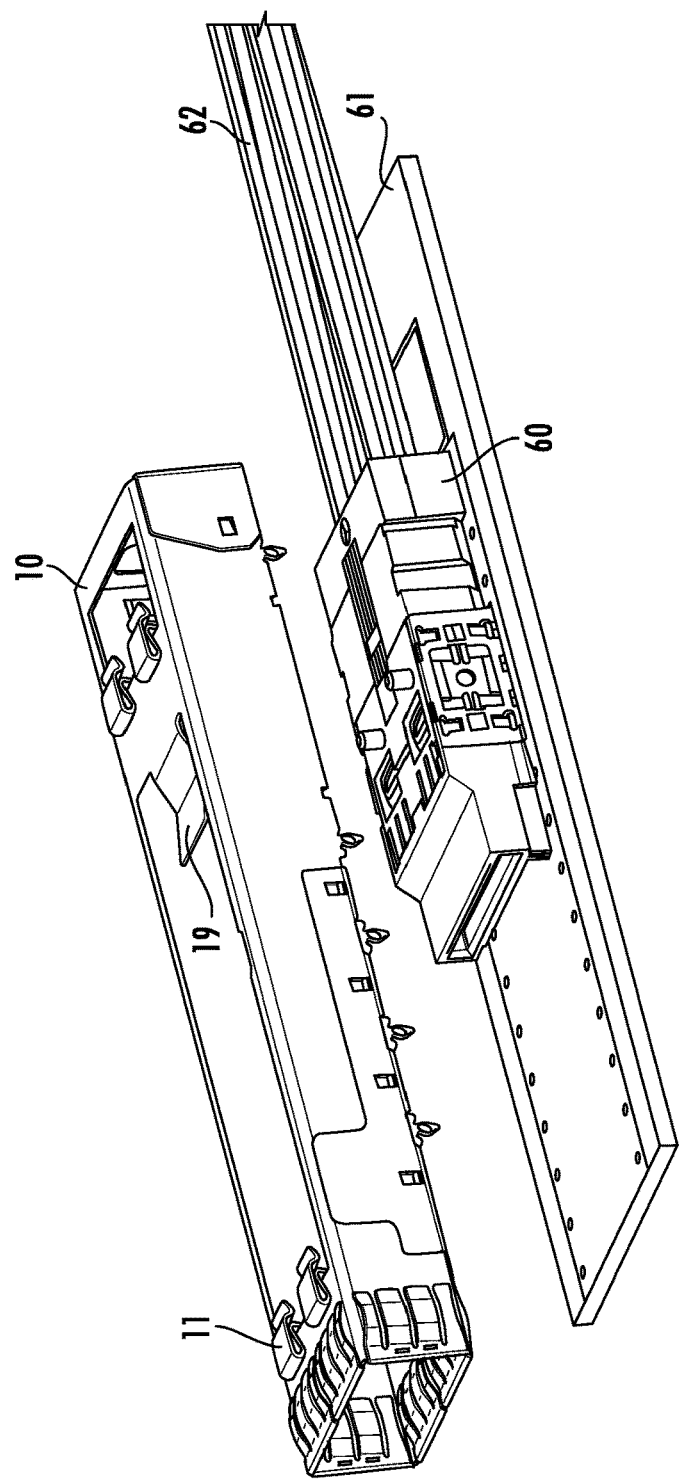
FIG. 67 is an exploded view showing a cage and an electrical connector according to a preferred embodiment of the present invention.

As shown in FIGS. 67-69, the cages 10 of the preferred embodiments of the present invention can include an electrical connector 60 into which the transceiver 30 is plugged. The electrical connector 60 provides a mechanical connection to secure the transceiver 30 to a mounting substrate 61 and electrical connections between the transceiver 30 and the mounting substrate 61. Any suitable substrate can be used for the mounting substrate 61 including, for example, a PCB. The cages 10 of the preferred embodiments of the present invention can include, for example, the receptacle connectors disclosed in, for example, in FIG. 11 of U.S.

application Ser. No. 15/261,295. The electrical connector 60 can include electrical contacts and be directly connected to the mounting substrate 61 in a fixed arrangement as shown by the lower connector in FIG. 5A of U.S. application Ser. No. 15/261,295, or the electrical connector can include cables 62 that can be high-speed and/or low-speed cables and can be connected to the mounting substrate 61 through the cables 62 in a floating arrangement as shown, for example, by the upper connector in FIG. 5A of U.S. application Ser. No. 15/261,295. Although not shown in FIG. 69, if needed, a thermal path can be provided between the block 42 and the electrical connector 60. For example, the block 42 can extend further into the cage 10*m* and a thermally conductive material can be provided on the electrical connector 60 to establish a thermal path between the electrical connector 60 and the heatsink 20.

According to preferred embodiments of the present invention, the heatsinks 20 float with respect to the cages 10 and travel both up and down within the cages. The floating heatsink 20 with up and down travel can accommodate transceivers 30 of different heights. The floating heatsink 20 can self-level with respect to the transceiver 30 to ensure proper mechanical connection between the transceiver 30 or connector inserted into the cage 10 and the heatsink 20.

The heatsinks 20 of the preferred embodiments of the present invention can include a ramp 28*a* near the front of the cage 10 where the transceiver 30 is inserted into the cage 10. When the transceiver 30 is inserted into the cage 10, the front of the transceiver 30 engages with the ramp 28*a* to push the floating heatsink 20 up. When the transceiver 30 is fully inserted into the cage 10, the arms 12 in the first preferred embodiment or the springs 11 in the second preferred embodiment push the heatsink 20 down, into contact with the transceiver 30 so that a thermal conduction path is established between the transceiver 30 and the heatsink 20.

Figure 59:
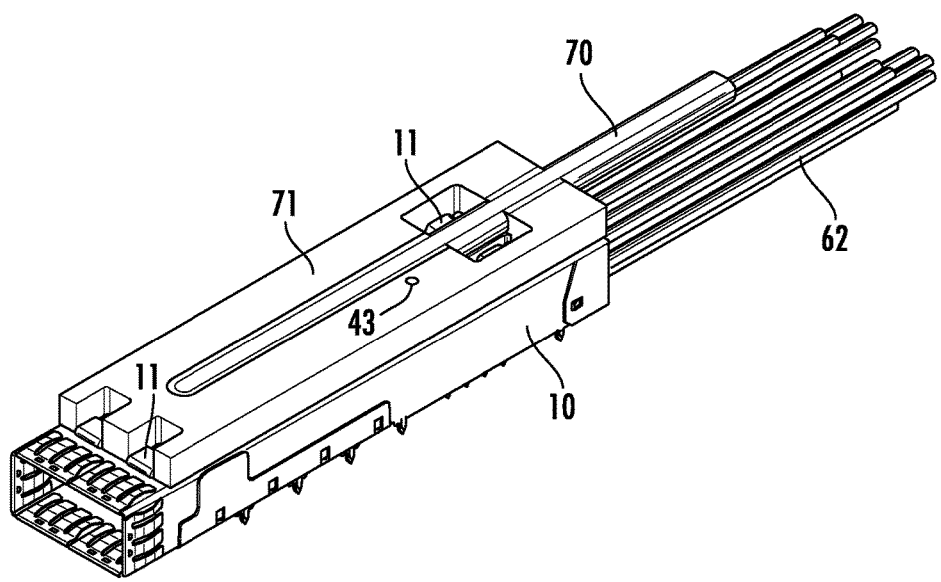
FIG. 59 is a perspective view of a cage with an attached heat pipe according to a preferred embodiment of the present invention.
Figure 60:
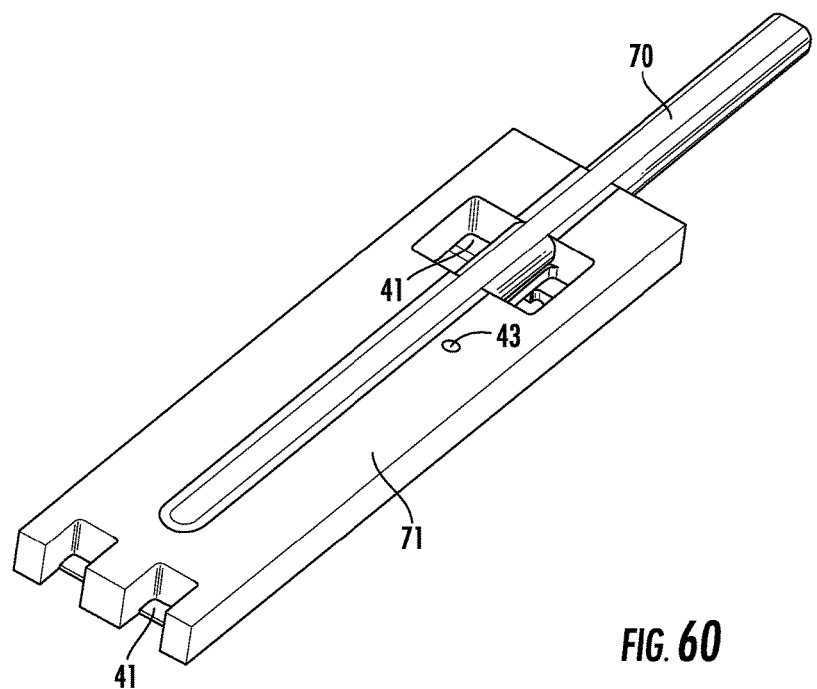
FIGS. 60 and 61 are perspective views of the heat pipe of FIG. 59.

As shown in FIGS. 59-61, a heat pipe 70 can be used instead of heatsink 20. The cage 10 shown in FIG. 57 can accommodate either the heatsink 20 or the heat pipe 70. The heat pipe 70 includes a base 71 that is connected to the cage 10 by the springs 11. Although not shown in the drawings, it is also possible to use liquid cooling instead of the heatsink 20 or the heat pipe 70. The liquid cooler can be attached to the cage 10 in a similar manner as the heatsink 20 and the heat pipe 70 such that the liquid cooler floats within the cage 10.

Figure 24:
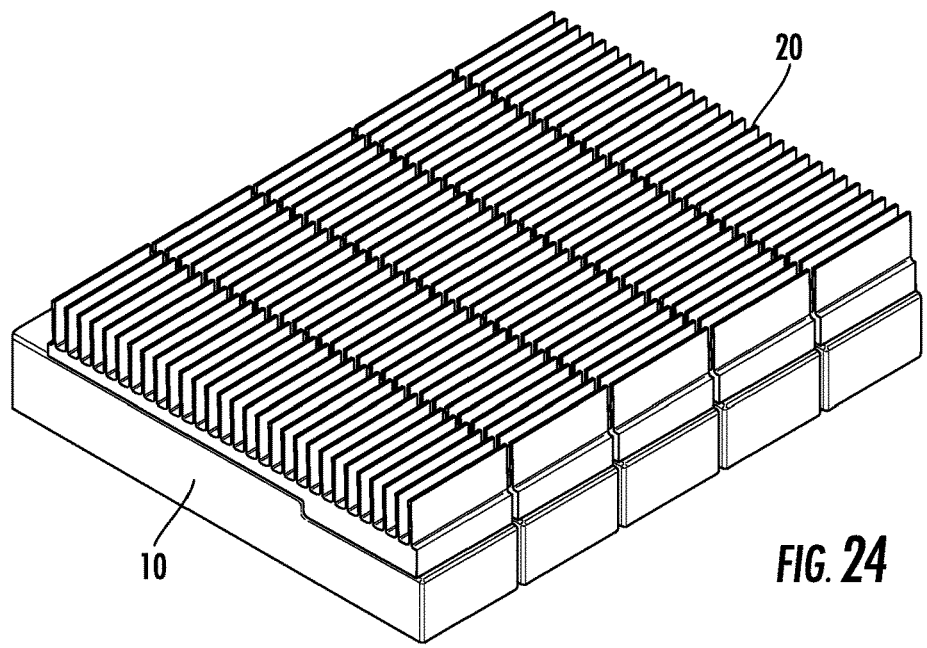
FIGS. 24 and 25 show an array of cages of FIG. 1 with heatsinks.
Figure 25:
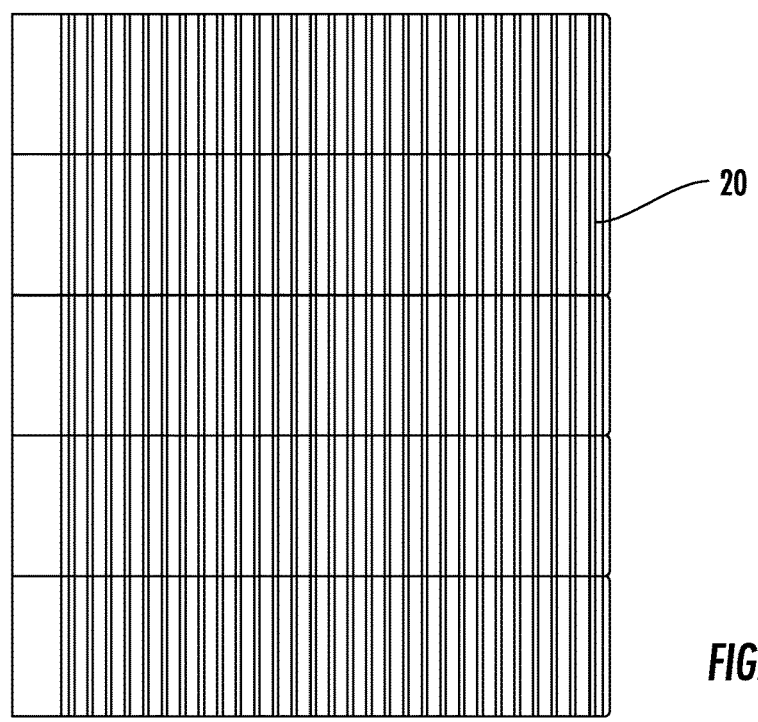
Figure 57:
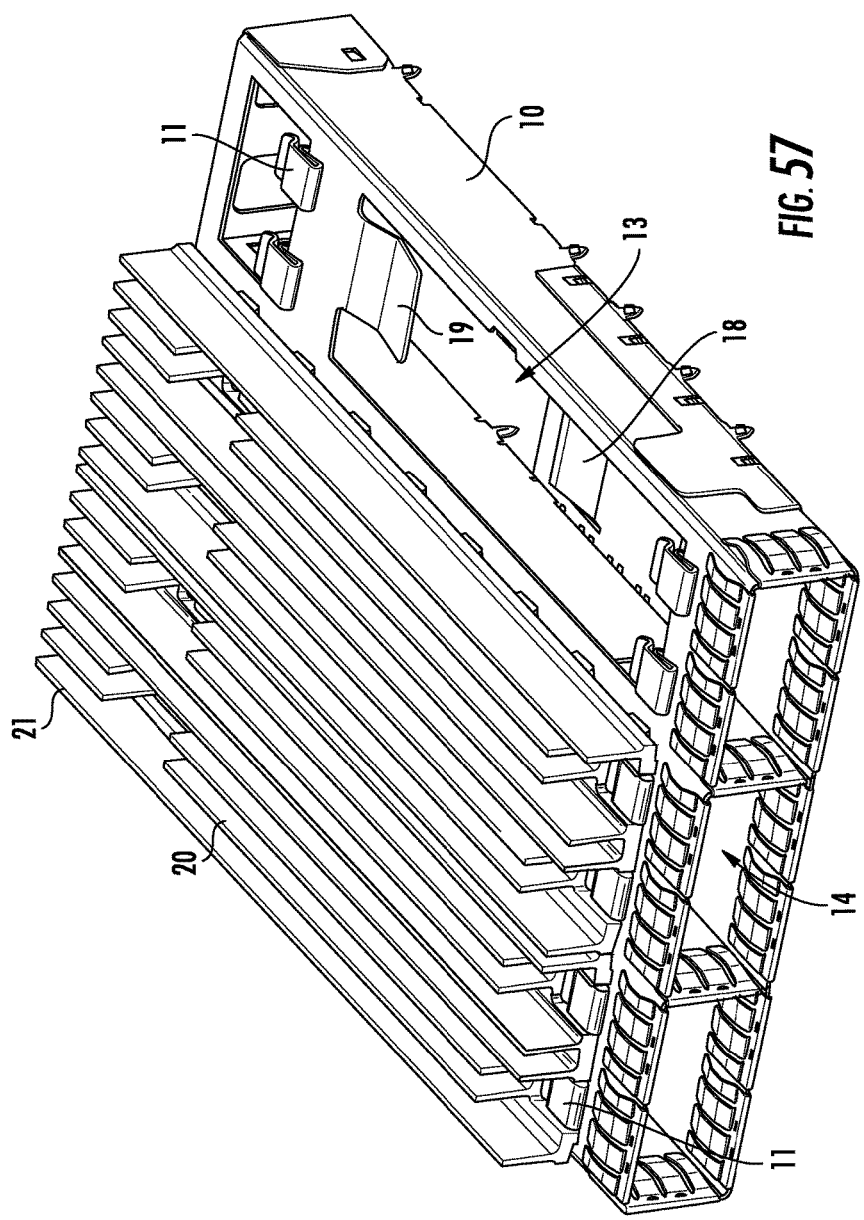
FIG. 57 shows an array of cages according to a preferred embodiment of the present invention.

The cages 10 can be arranged in an array as shown, for example, in FIGS. 24, 25, and 57. Each of the heatsinks 20 independently floats with respect to the cage 10 that the heatsink 20 is attached to, i.e., each heatsink 20 is independently biased. FIGS. 24 and 25 show five cages 10 arranged next to each other in a line, and FIG. 57 shows three cages 10 arranged next to each other in a line. But any number of cages 10 can be aligned next to each other. In FIGS. 24 and 25, each of the cages 10 includes a heatsink 20, and in FIG. 57, two of the cages 10 include a heatsink 20, and one of the cages 10 does not include a heatsink 20. In FIGS. 24, 25, and 57, because no structure of the cage 10 or heatsink 20 extends laterally outward, the cages 10 can be directly adjacent to each other, which decreases the amount of PCB area required by the cages 10. It is also possible, as shown in FIGS. 62 and 63, to have the heatsink 20 extend laterally outward from the cage 10 to increase the heat dissipation of the heatsink 20.

For example, a 1 U (1.752 inches) rack unit can include an array of 1×32 cages arranged side-by-side. The heatsink 20 of preferred embodiments of the present invention can dissipate up to about 14 W/cage when operated at a temperature of 70° C. or less. Thus, in a rack unit with 32 channels, heatsinks 20 of the preferred embodiments of the present invention can dissipate enough heat to ensure proper operation of the transceiver 30 when each channel generates up to 14 W/channel at an operating temperature of 70° C. or less. These thermal requirements can be met using only the heatsinks 20 of the preferred embodiments of the present invention. No other thermal dissipating structures are needed to ensure the proper operation of the transceivers 30 and the other electronic components within the rack unit. To meet these thermal requirements, a heatsink 20 that extends laterally outward as shown, for example, in FIGS. 62 and 63, and that increases heat dissipation, can be used.

First Preferred Embodiment of the Present Invention

FIGS. 1 and 2 show a transceiver 30 plugged into a cage 10 with an attached heatsink 20 according to a first preferred embodiment of the present invention. FIGS. 3-7 show the cage 10 of the first preferred embodiment of the present invention. The cage 10 includes arms 12 that extend into an opening 13 in the cage 10. The arms 12 are used to secure the heatsink 20 to the cage 10, to allow the heatsink 20 to float when a transceiver 30 is not inserted into the cage 10, and to push the heatsink 20 into contact with the transceiver 30 when the transceiver 30 is inserted into the cage 10 through opening 14.

The arms 12 are preferably stamped and formed when the cage 10 is manufactured such that the cage 10 and arms 12 define a monolithic body, i.e., define a single unitary structure. Other possible arrangements are also possible. For example, cages 10 could be stamped, and then the arms 12 could be added to the cage 10 such that each of the arms 12 extend into the opening 13 of the cage 10.

Figure 3:
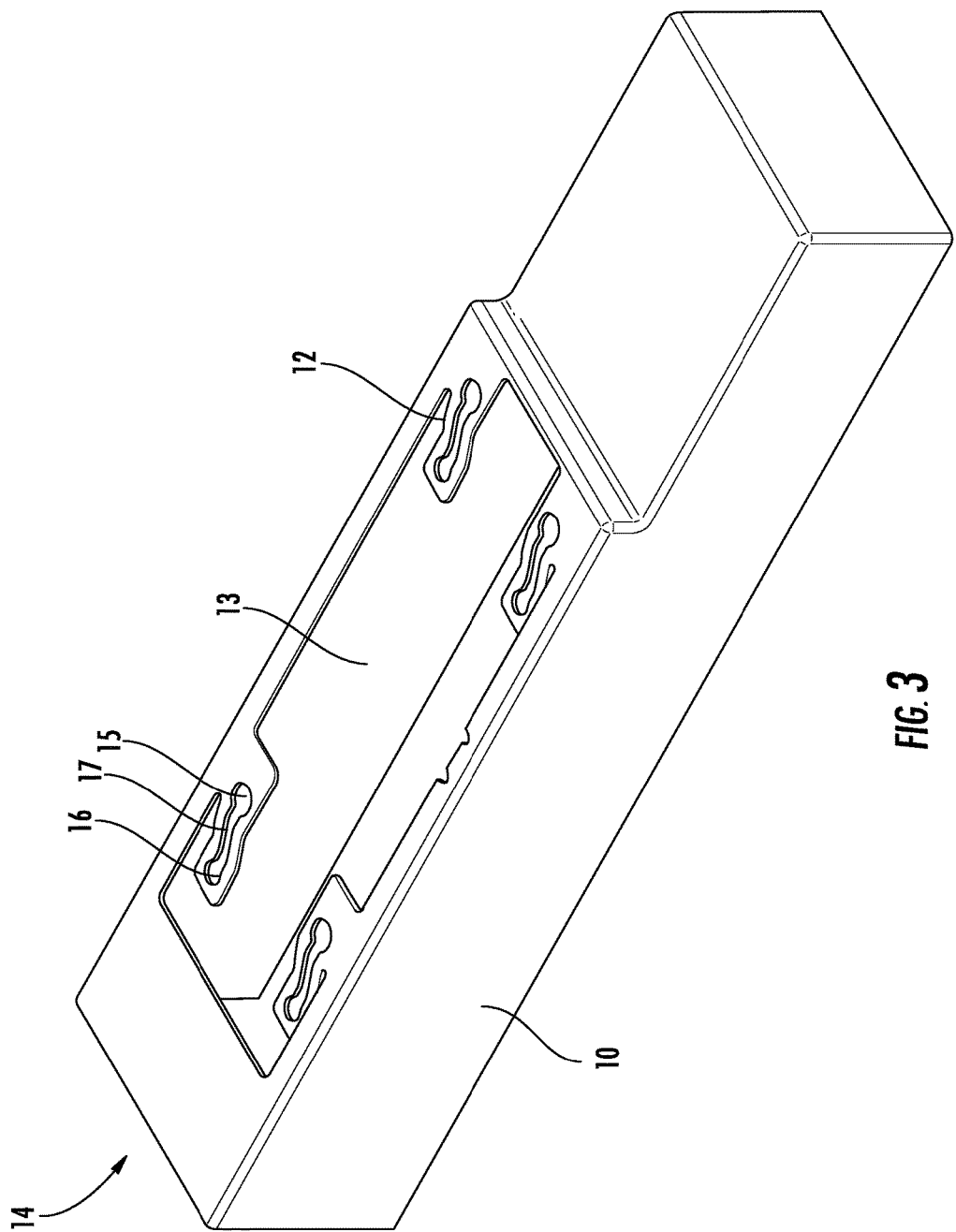
FIGS. 3 and 4 are perspective views of the cage of FIG. 1.
Figure 4:
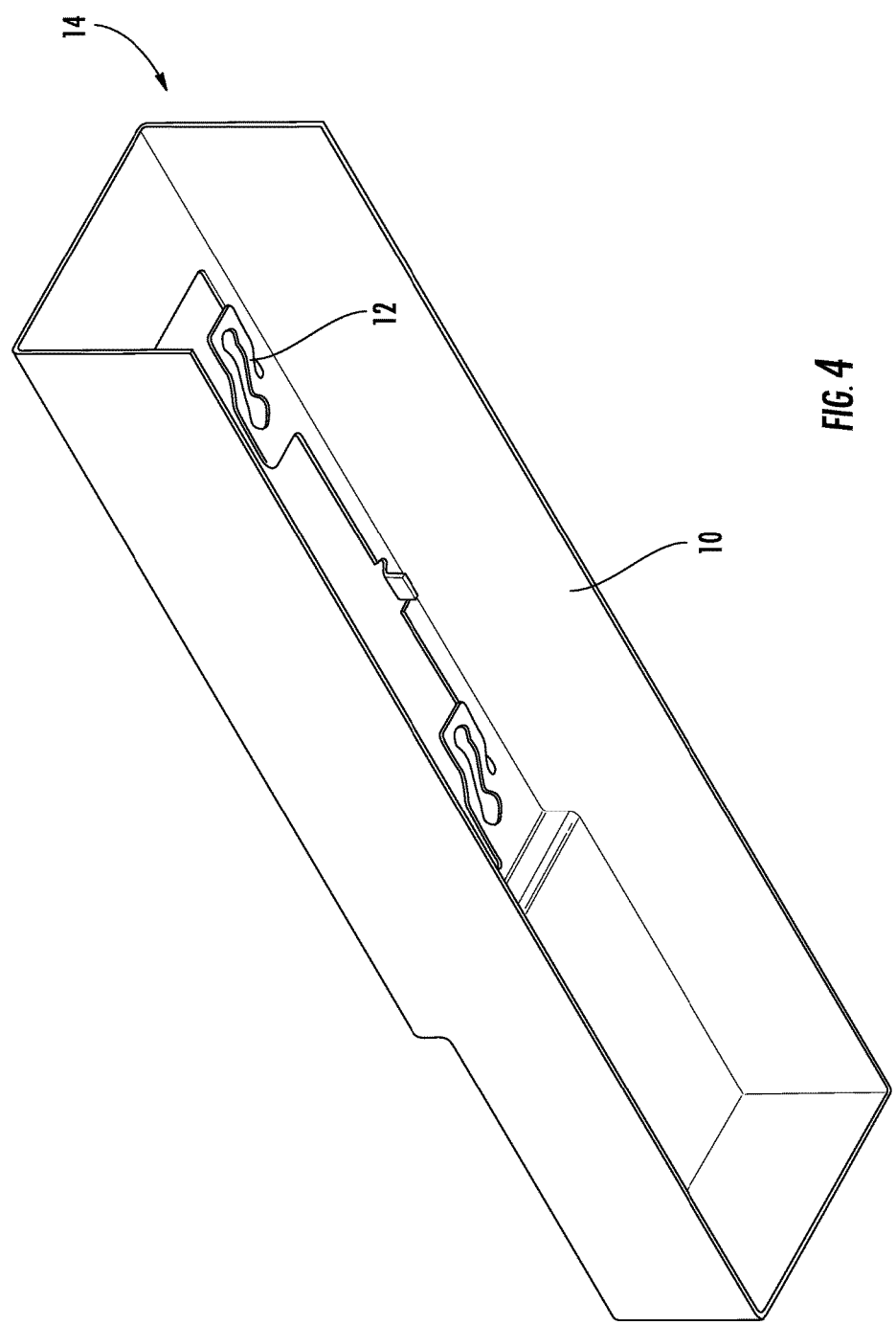
Figure 7:
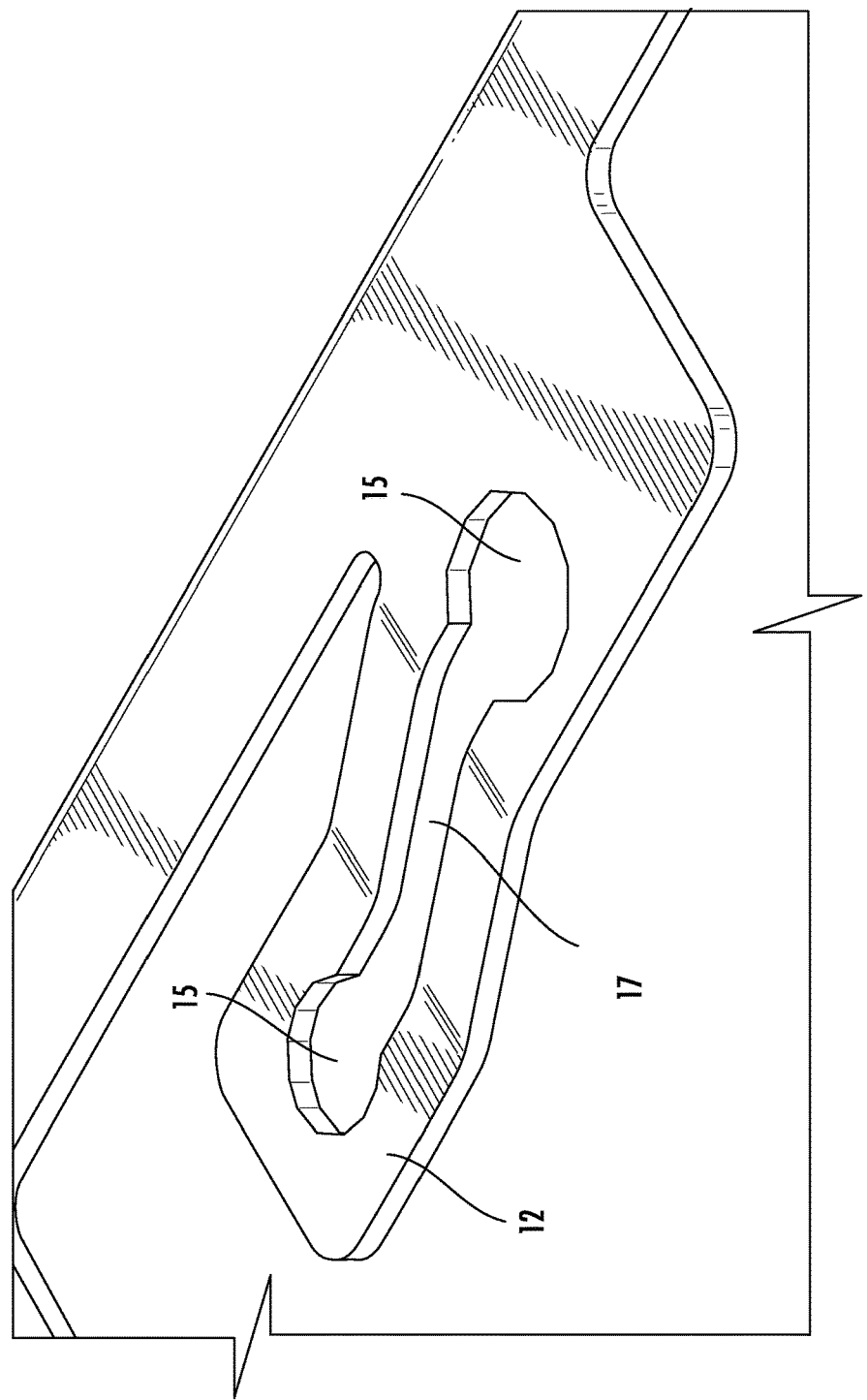
FIG. 7 is a close-up view of the locking guide of the cage of FIG. 1.

Each of the arms 12 can extend from the cage 10 in the same general direction. For example, in FIG. 5, each of the arms 12 extend from the cage 10 towards the top of the page. FIGS. 3-5 show four arms 12, but any number of arms, including, for example, two arms, can be used. Each arm 12 can include a slot 17 with an insertion hole 15 at one end of the slot 17 and with a locking hole 16 at the other end of the slot 17. As seen in FIG. 7, the insertion hole 15 is bigger than the locking hole 16. The insertion hole 15 is the hole into which the retention pin 22 of the heatsink 20 can be inserted. Once the retention pin 22 is inserted into the insertion hole 15, the heatsink 20 can be slid along the slot 17 until the retention pin 22 is locked into the locking hole 16. The locking hole 16 locks the heatsink 20 to the cage 10, preventing movement of the heatsink 20 in the plane defined by the opening 13 and preventing the heatsink 20 from being disengaged from the cage 10.

Figure 26:
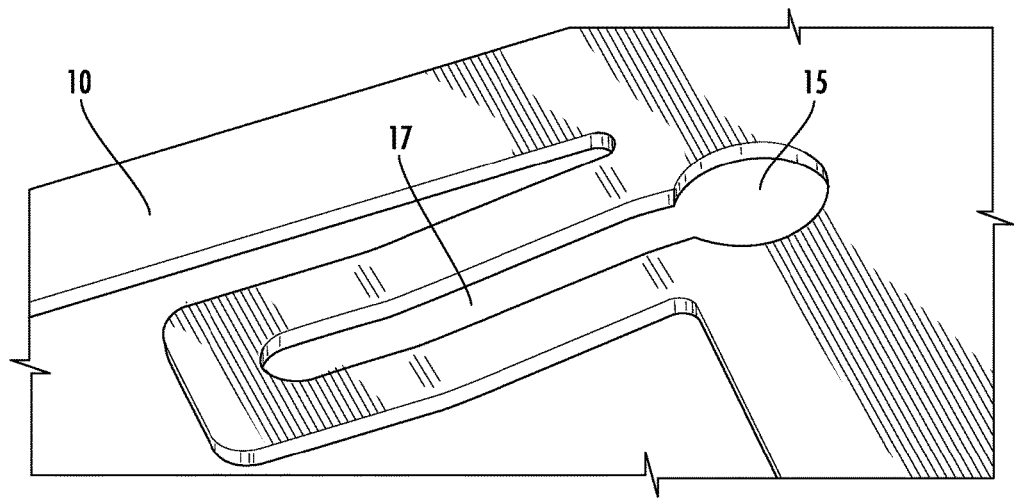
FIG. 26 is a close-up view of an alternative arm with a single hole.
Figure 27:
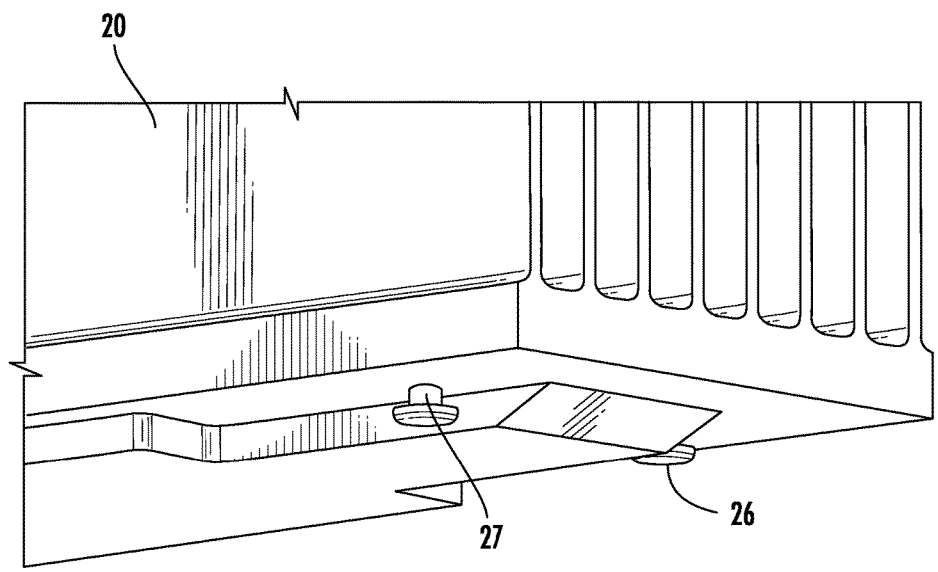
FIG. 27 is a close-up view of an alternative post with a single diameter.
Figure 28:
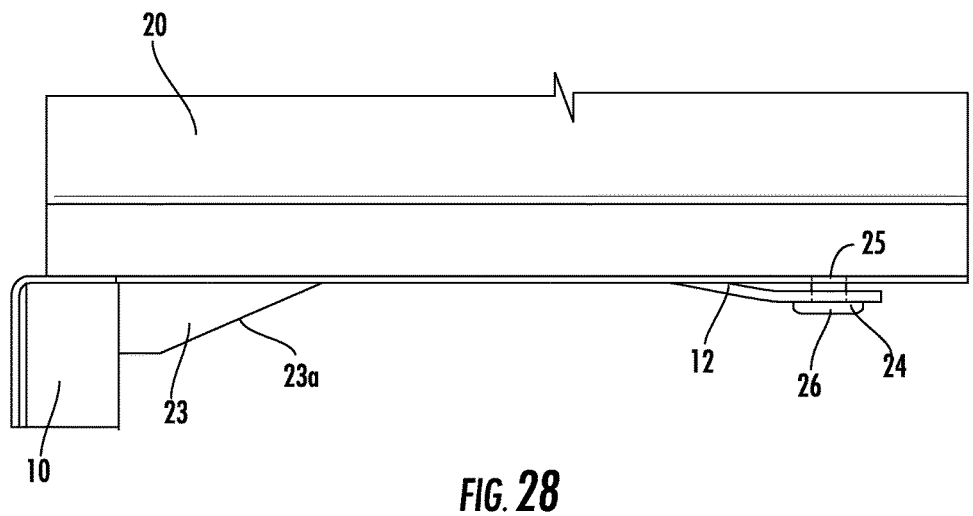
FIG. 28 is close-up view of a heatsink with the alternative post attached to a cage with the alternative arm.

Alternatively, as shown in FIG. 26, one or more of the arms 12 can contain a slot 17 with a single hole, i.e., the insertion hole 15, located at one end of the slot 17. Without the locking hole 16, the arm 12 prevents movement of the heatsink 20 in the plane defined by the opening 13 except along the direction defined by the slot 17, allowing the heatsink 20 to be slid back and forth along the slot 17 and to be disengaged from the cage 10. FIG. 27 shows an alternative retention pin 26 that includes a post 27 with a single diameter. Because there is no locking hole 16 in the preferred embodiment shown in FIG. 27, the post 27 of the alternative retention pin 26 does not need a second diameter. As shown in FIG. 28, the alternative retention pin 26 is placed through the insertion hole 15, and when the heatsink 20 is slid forward, the retention key 23 on the body of the heatsink 20 can be used to engage the cage 10 to prevent the alternative retention pin 26 from being slid backward to the insertion hole 15, thus retaining the heatsink 20.

As shown in FIGS. 3-5 and 26, the arms 12 are cantilevered such that the arms 12 extend into the cage 10, i.e., below a plane defined by opening 13. The arms 12 provide a downward force on the heatsink 20 so that the heatsink 20 will contact a transceiver 30 when the transceiver 30 is plugged into the cage 10. The arms 12 automatically bias the heatsink 20 against the transceiver 30. The arms 12 allow the heatsink 20 to float and to travel both up and down. The floating heatsink 20 with up and down travel can accommodate transceivers of different heights. The heatsink 20 does not need a spring or a strap that exerts a force on the top, side, or rear surfaces of the heatsink 20. As shown in FIG. 56, the cage 10 can include springs 18 on the bottom that push the floating heatsink 20 (not shown in FIG. 56) up towards the top of the cage 10. The springs 18 on the bottom can have a similar spring force over a similar deflection range as the arms 12, which allows the transceiver PCB to align with the opening of the electrical connector 60 (not shown in FIG. 56) and which reduces asymmetric loading forces of the transceiver PCB on the cage-connector contacts.

Although the cage 10 in FIGS. 3-7 is preferably rectangular, the cage 10 could have any suitable shape. FIGS. 3-7 only show the basic outline of the cage 10, but the cage 10 could have additional structures. For example, the cage 10 could include additional openings, including, for example, for thermal management. As discussed above, the cage 10 could also have different mounting structures. For example, the cage 10 can include press-fit pins that can be inserted into holes in a PCB or can include through-hole pins or SMT tabs that can be soldered to a PCB.

Figure 9:
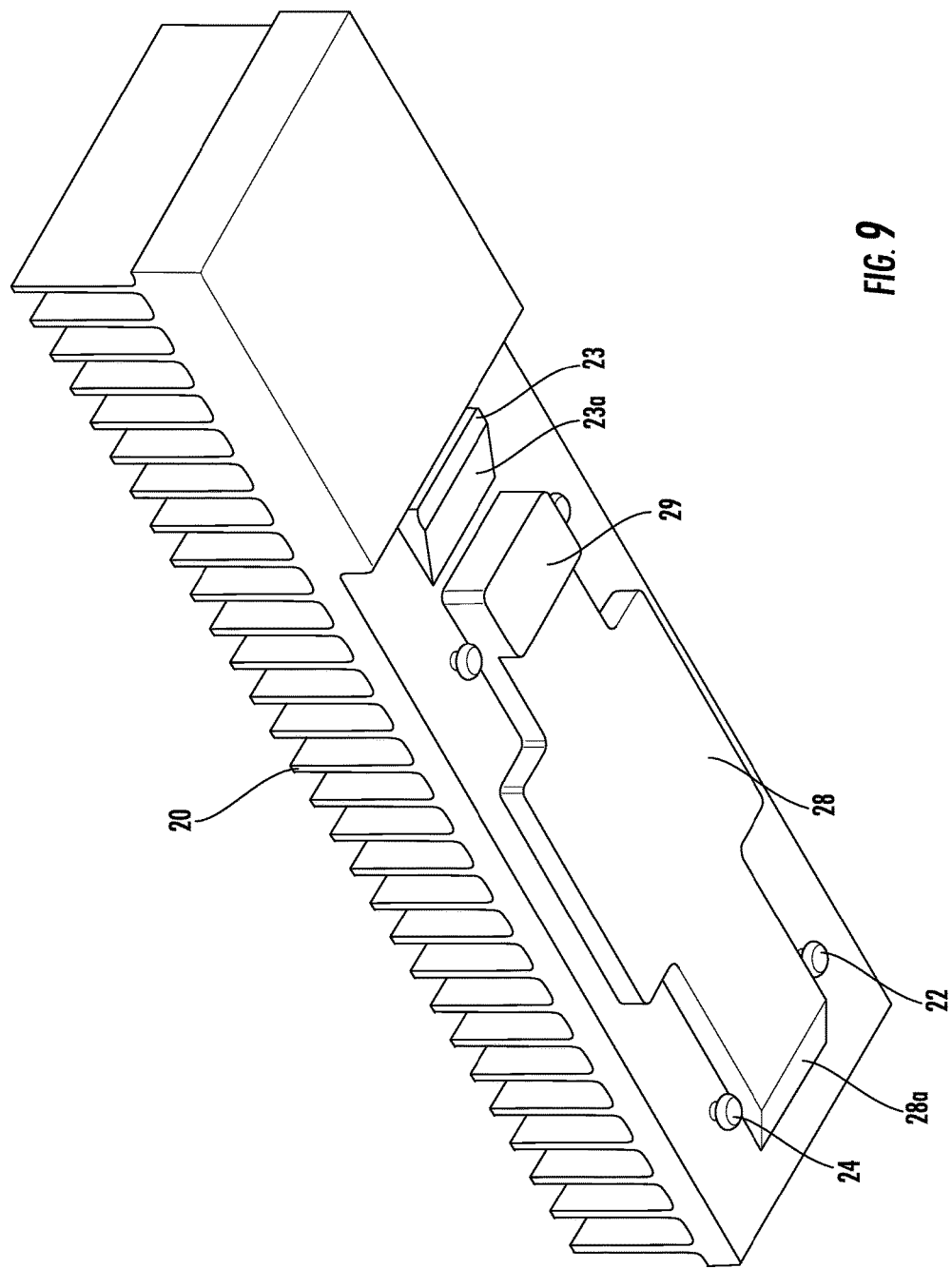
Figure 12:
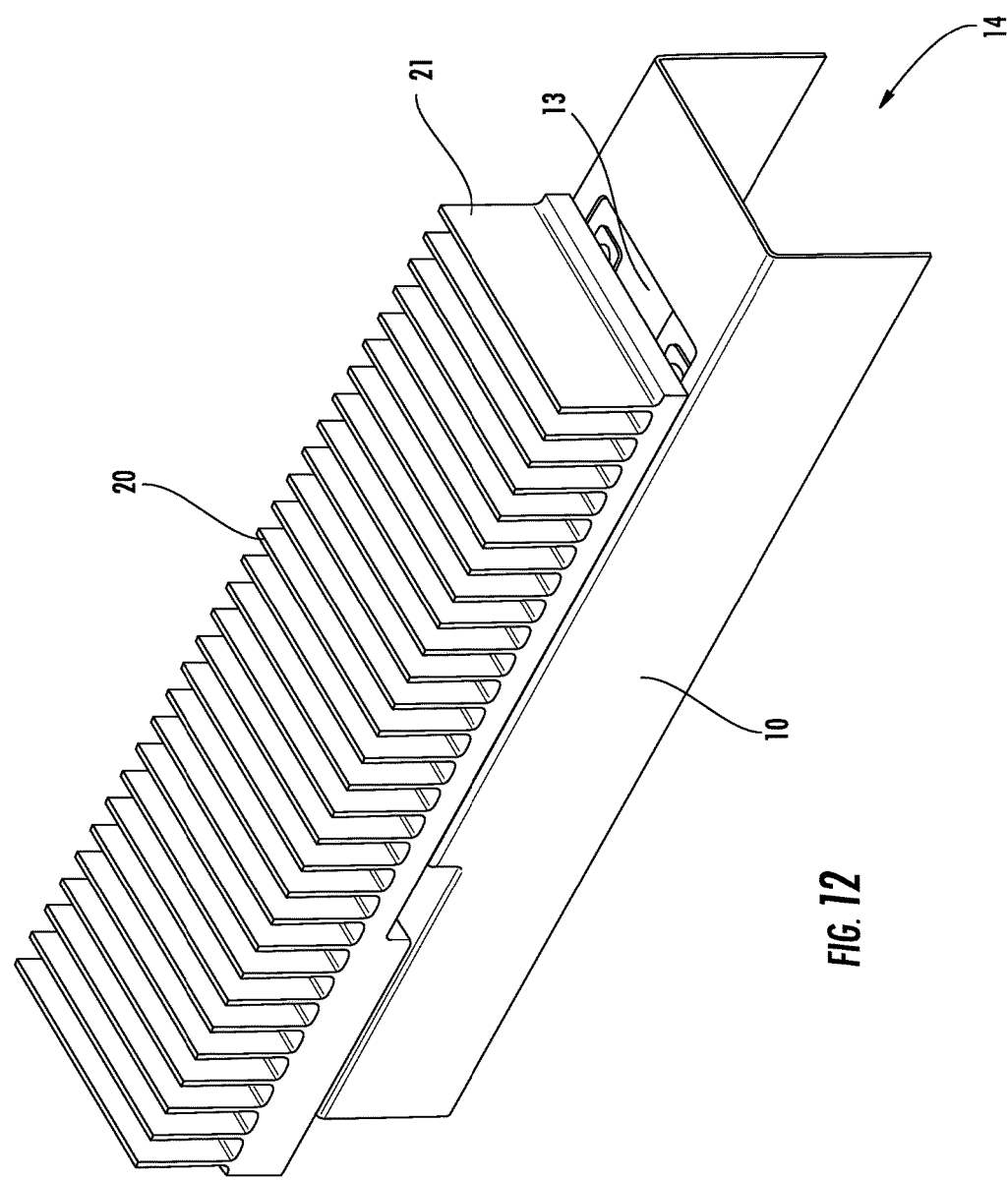
Figure 13:
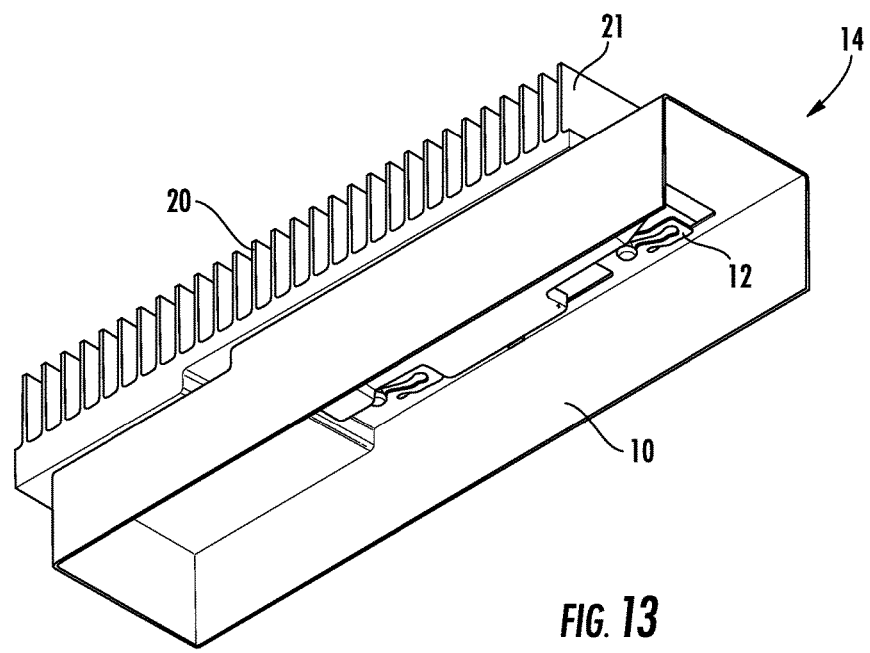
Figure 14:
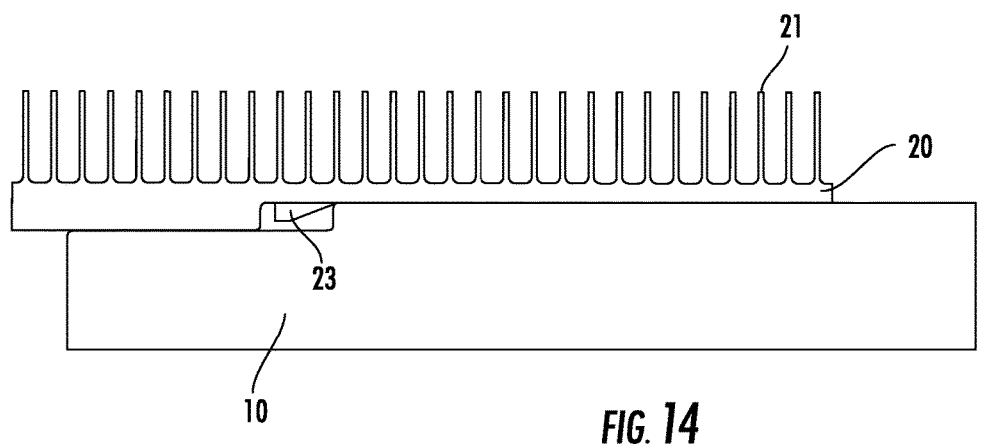
Figure 17:
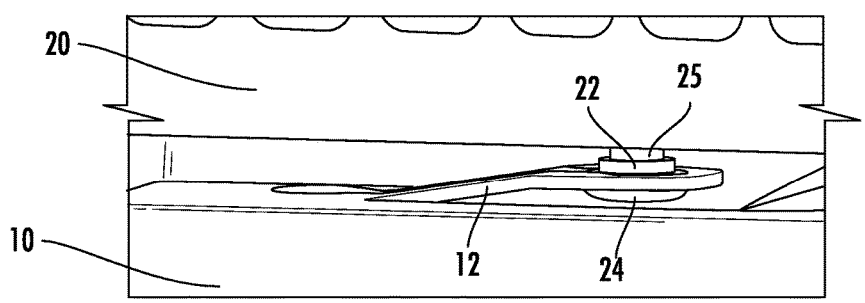

FIGS. 8-11 show the heatsink 20. The heatsink 20 includes retention pins 22 that extend from the body of the heatsink 20. FIGS. 9 and 11 show four retention pins 22, but any number of retention pins could be used. The number of arms 12 and the number of retention pins 22 would typically be the same. Each retention pin 22 includes a post 25 and a cap 24. As shown in FIG. 10, the retention pins 22 preferably extend from the bottom of the heatsink 20 by a smaller distance than a distance by which the protrusion 28 extends from the bottom of the heatsink 20, which ensures that the protrusion 28 engages with the transceiver 30 without the retention pins 22 interfering with the transceiver 30. The diameter of the post 25 is smaller than the width of the slot 17, and the diameter of the cap 24 is larger than the width of the slot 17, is larger than the diameter of the locking hole 16, and is smaller than the diameter of the insertion hole 15. The post 25 and cap 24 dimensions allow the retention pins 22 to be inserted into the insertion holes 15, slid along the slots 17, and locked into place by the locking holes 16. As shown in FIG. 17, the post 25 can include a second diameter that is the same or substantially the same, within manufacturing tolerances, as the diameter of the locking hole 16, which ensures that the retention pins 22 are locked into the arms 12.

The heatsink 20 includes a protrusion 28 that extends from the body of the heatsink 20 and into the opening 13 when the heatsink 20 is attached to the cage 10. The protrusion 28 extends into the opening 13 to contact the transceiver 30 and other components positioned inside the cage 10 or just the transceiver 30. As seen by comparing FIGS. 5 and 9, the outline of the protrusion 28 can match the outline of the opening 13 including the arms 12. It is possible that the outlines of the protrusion 28 and the opening 13 do not match, but matching allows for the protrusion 28 with the largest area, which provides the most heat conduction. The outline can define any shape. As shown in FIG. 11, the protrusion 28 defines, in a plan outline view, two superimposed quadrilaterals, i.e., a rectangular perimeter superimposed over a square perimeter. This shape can maximize surface area contact between a transceiver or other connector inserted into the cage 10, and can provide a keying feature to align the heatsink 20 and the opening 13 in the cage 10. Outlines or perimeters other than a rectangular shape can be used.

The heatsink 20 can also include an insertion key 29 and a retention key 23. The insertion key 29 helps orient the heatsink 20 with respect to the cage 10, and the retention key 23 prevents the heatsink 20 from being unattached from the cage 10.

Figure 18:
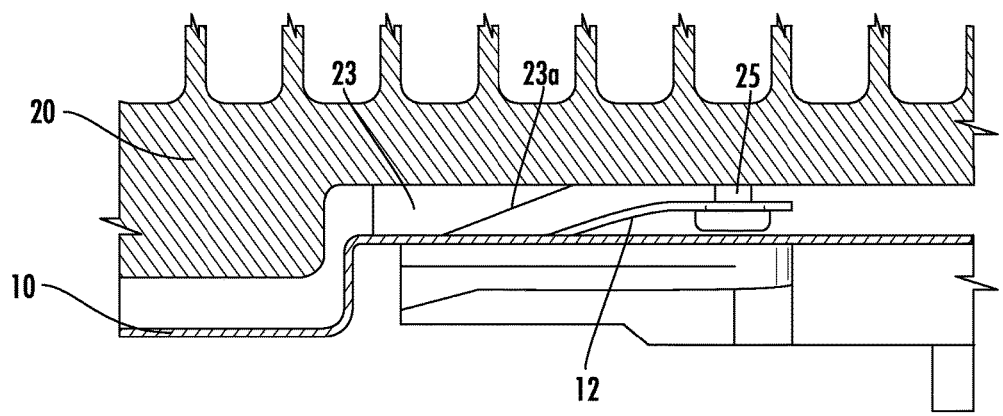
Figure 19:
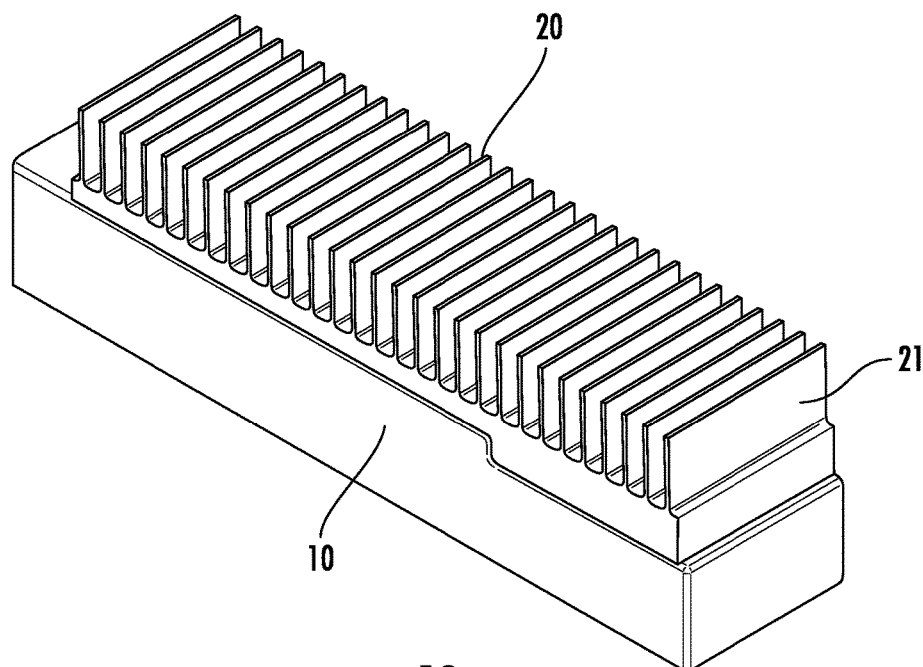
FIGS. 19-23 show a second step in attaching the heatsink to the cage of FIG. 1.
Figure 20:
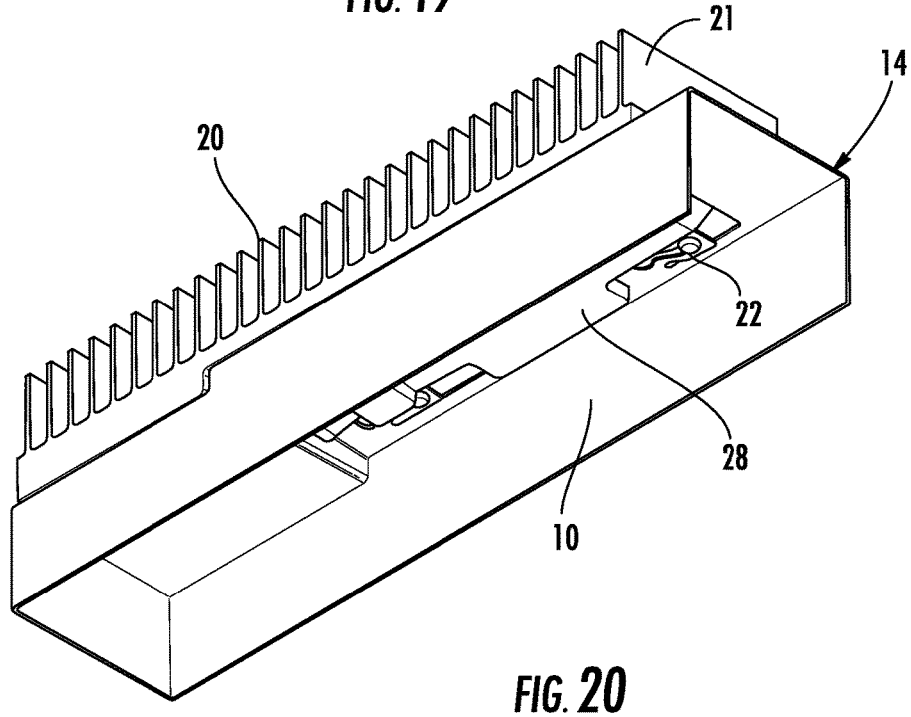
Figure 21:
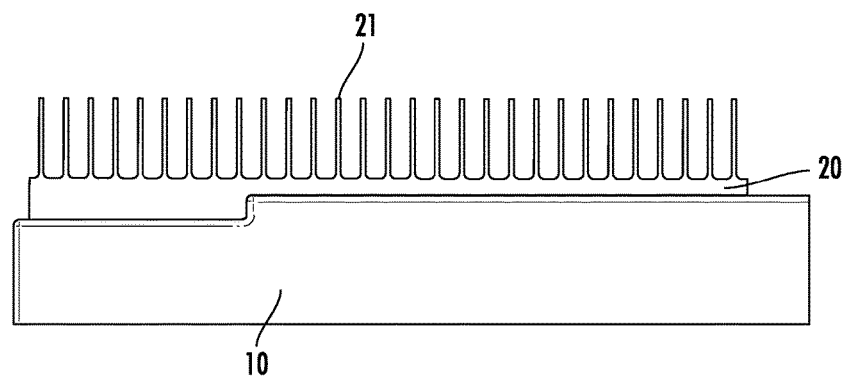
Figure 22:
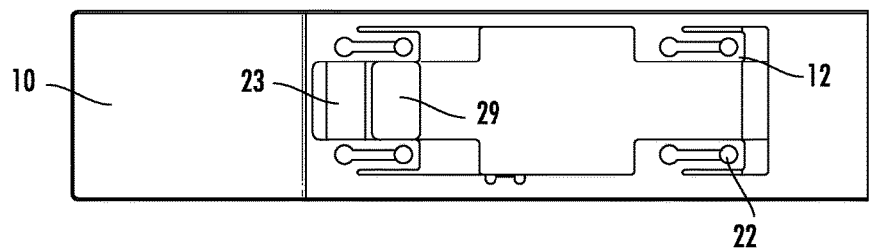
Figure 23:
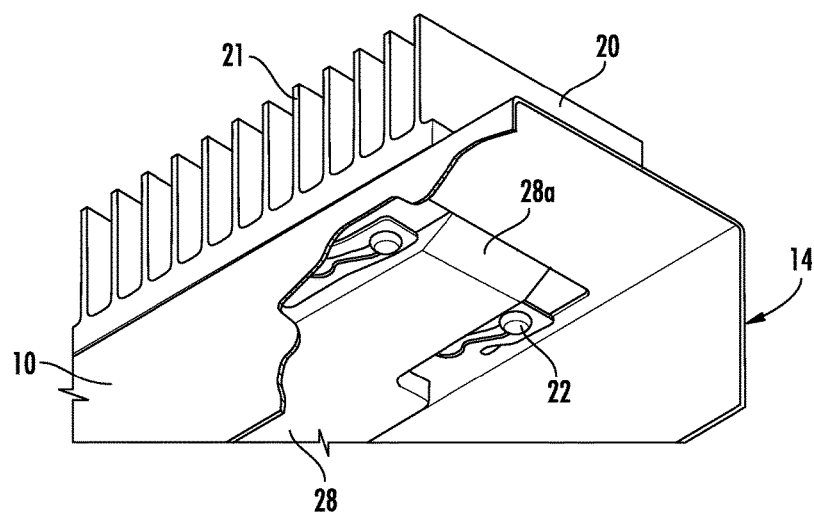

FIGS. 12-18 show a first step of attaching the heatsink 20 to the cage 10. FIGS. 12-16 are various views showing the retention pins 22 inserted into the insertion holes 15. If the heatsink 20 includes an insertion key 29, then the insertion key 29 can help orient the heatsink 20 with respect to the cage 10. FIG. 16 is a close-up view of the arrangement of the retention key 23 and the insertion key 29 with respect to the cage 10. In this position shown in FIG. 16, the insertion key 29 is within the opening 13 and the retention key 23 is outside of the opening 13. The retention key 23 can include a ramp 23a that engages with the cage 10 as the retention pins 22 are slid in the slots 17. The ramp 23a of the retention key pushes the cage 10 away from the heatsink 20. FIGS. 17 and 18 are close-up views of the cage 10 and heatsink 20 after the retention pins 22 are slid along the slot 17 and engage the locking holes 16. The bottom of the retention key 23 engages the top of the cage 10 such that the arms 12 extend out of the opening 13. FIGS. 1 and 2 also show this same position.

FIGS. 19-23 are various views showing the heatsink 20 attached to the cage 10. The heatsink 20 is in its final position with respect to the cage 10. Both the retention key 23 and insertion key 29 are within the opening 13, and the arms 12 extend into the cage 10. The surface of the retention key 23 opposite to the ramp 23a prevents the heatsink 20 from being unattached with the cage 10. When a transceiver 30 is inserted into the cage 10, the arms 12 act as springs that push the protrusion 28 against the transceiver 30. The protrusion 28 can include a ramp 28a that engages with the front of the transceiver 30 as the transceiver 30 is pushed into the cage 10.

With the cage 10 of the first preferred embodiment, it is possible to use a heat pipe 70 as shown in FIGS. 59-61 or the zippered structure 72 and the base 73 as shown in FIGS. 64 and 65 instead of heatsink 20. A cap 24 and retention pins 22 or 26 can be added to the base 71 of the heat pipe 70 or the base 73 of the zippered structure 72 so that the arms 12 can secure the base 71 or 73 to the cage 10 of the first preferred embodiment.

FIGS. 24 and 25 show an array of cages 10 with heatsinks 20. In FIGS. 24 and 25, five cages 10 are arranged next to each other in a line. But any number of cages 10 can be aligned next to each other. Because no structure from the cage 10 or heatsink 20 extends laterally outward, the cages 10 can be directly adjacent to each other, which decreases the amount of PCB area required by the cages 10.

The cage 10 of the first preferred embodiment may include first and second walls that are spaced apart from each and a third wall that spans the first and second walls. The first, second or third wall may include or define the opening 13, and two or more arms 12 can each extend into the opening 13. The cage 10 may further include a fourth rear wall perpendicular to the third wall, a fifth bottom wall (not shown) parallel to the third wall, and the opening 14 configured to receive a module, transceiver, or some other electrical or optical interconnect. The first wall can include a first edge and an opposed second edge. The second wall can include a third edge and an opposed fourth edge, and the third wall can include a fifth edge and an opposed sixth edge. The first wall and the second wall may be parallel or substantially parallel to each other. The fifth edge of the third wall may be attached to the first edge of the first wall and the opposed sixth edge of the third wall may be attached to the third edge of the second wall. The opposed second edge of the first wall and the opposed fourth edge of the second wall are configured to be positioned adjacent to a mounting substrate (not shown), such as a PCB. The opposed second and fourth edges of the first and second walls may further define board or substrate mounting tails, such as press fit, eye-of-the-needle (EON) compliant pins, or surface-mount technology (SMT) tails. EON compliant pins are shown on the cage 10 of the second preferred embodiment of the present invention, as seen, for example, in FIG. 29. The two or more arms 12 may each extend into the opening 13 in plane with the first, second, or third wall, in a direction away from the third or top wall and towards the opposed second edge of the first wall or the opposed fourth edge of the second wall, or in a direction away from fins 21 of the heatsink 20.

Second Preferred Embodiment of the Present Invention

FIGS. 29 and 30 show a cage 10 with an attached heatsink 20 according to a second preferred embodiment of the present invention. While the cage 10 and the heatsink 20 in FIGS. 29 and 30 share some similarities with the cage 10 and the heatsink 20 in FIGS. 1 and 2, there are some differences, including how the heatsinks 20 attach to the cages 10 and how the heatsinks 20 and cages 10 are prevented from becoming unattached from each other.

In FIGS. 1 and 2, the heatsink 20 is attached to the cage 10 using the pins 22 or 26 on the heatsink 20 and the arms 12 on the cage 10, and in FIGS. 29 and 30, the heatsink 20 is devoid of pins and is attached to the cage 10 using springs 11 on the cage 10 that engage with pockets 41 in the heatsink 20. FIG. 30 is sectional side view that shows the springs 11 engaging with pockets 41 in the heatsink 20. The springs 11 are preferably leaf springs with an S-shape as shown in FIG. 30, but other suitable springs and shapes could also be used.

Figure 32:
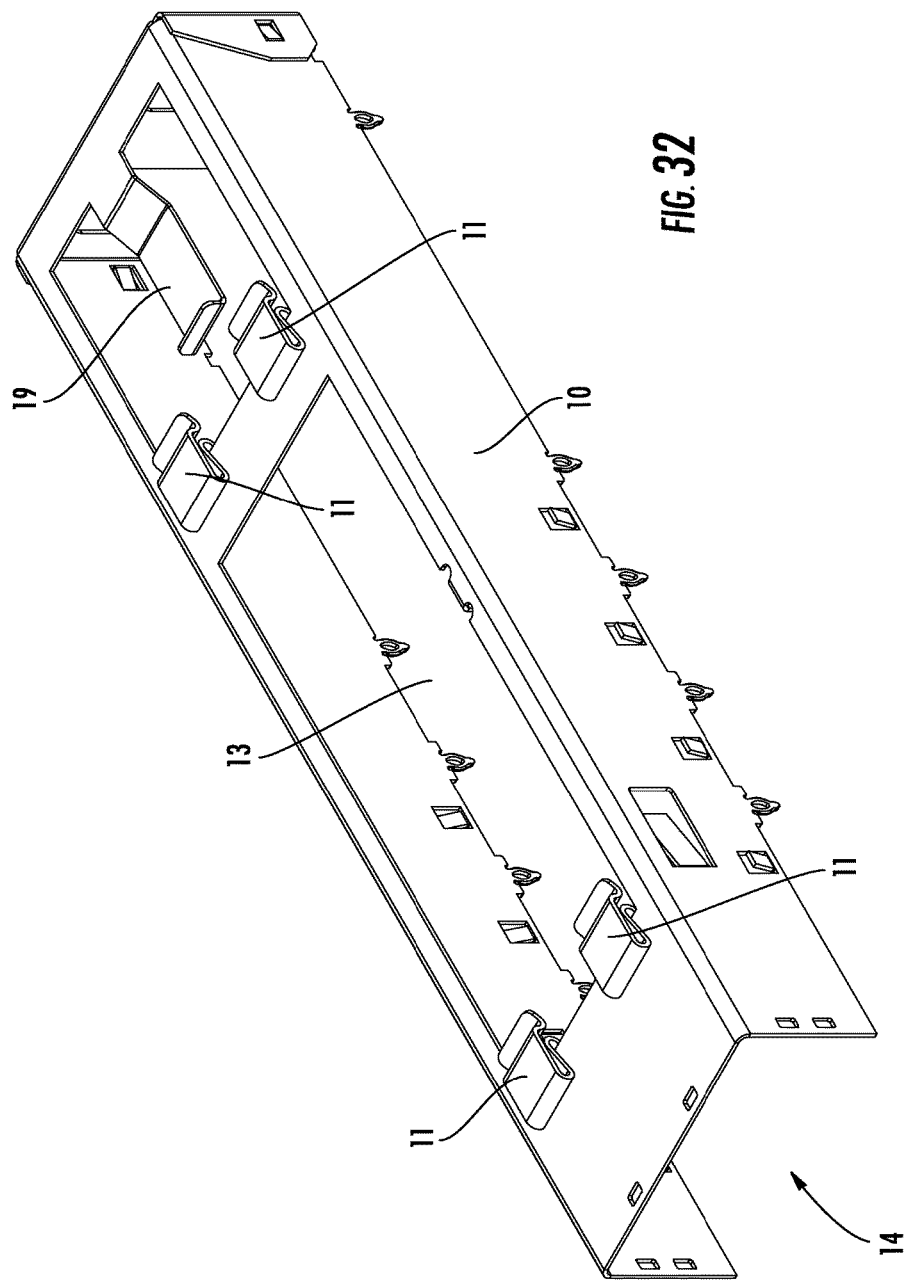
FIGS. 32 and 33 are perspective views of the cage of FIG. 29.

As shown in FIG. 10, the heatsink 20 of the first preferred embodiment is prevented from becoming unattached from the cage 10 by the retention key 22 in the heatsink 20, while, as shown in FIG. 31, the heatsink 20 of the second preferred embodiment is prevented from becoming unattached from the cage 10 by the retention latch 19 on the cage 10 engaging with the block 42 on the heatsink 20. FIGS. 32 and 57 show different possible arrangements for the retention latch 19 with respect to the openings 13. FIG. 32 shows the retention latch 19 located in the opening 13 in the rear of the cage 10, farther from the opening 14. FIG. 57 shows the retention latch 19 in the opening 13 in the front of the cage 10, closer to the opening 14. As shown in FIG. 57, the retention latch 19 can be laterally offset.

The springs 11 are preferably stamped and formed when the cage is manufactured such that the cage 10 and the springs 11 define a monolithic body, i.e., define a single unitary structure. Other possible arrangements are also possible. For example, the cages 10 could be stamped and then the springs 11 could be added to the cage 10 Such that each of the springs 11 extend into the opening 13 of the cage 10.

Figure 33:
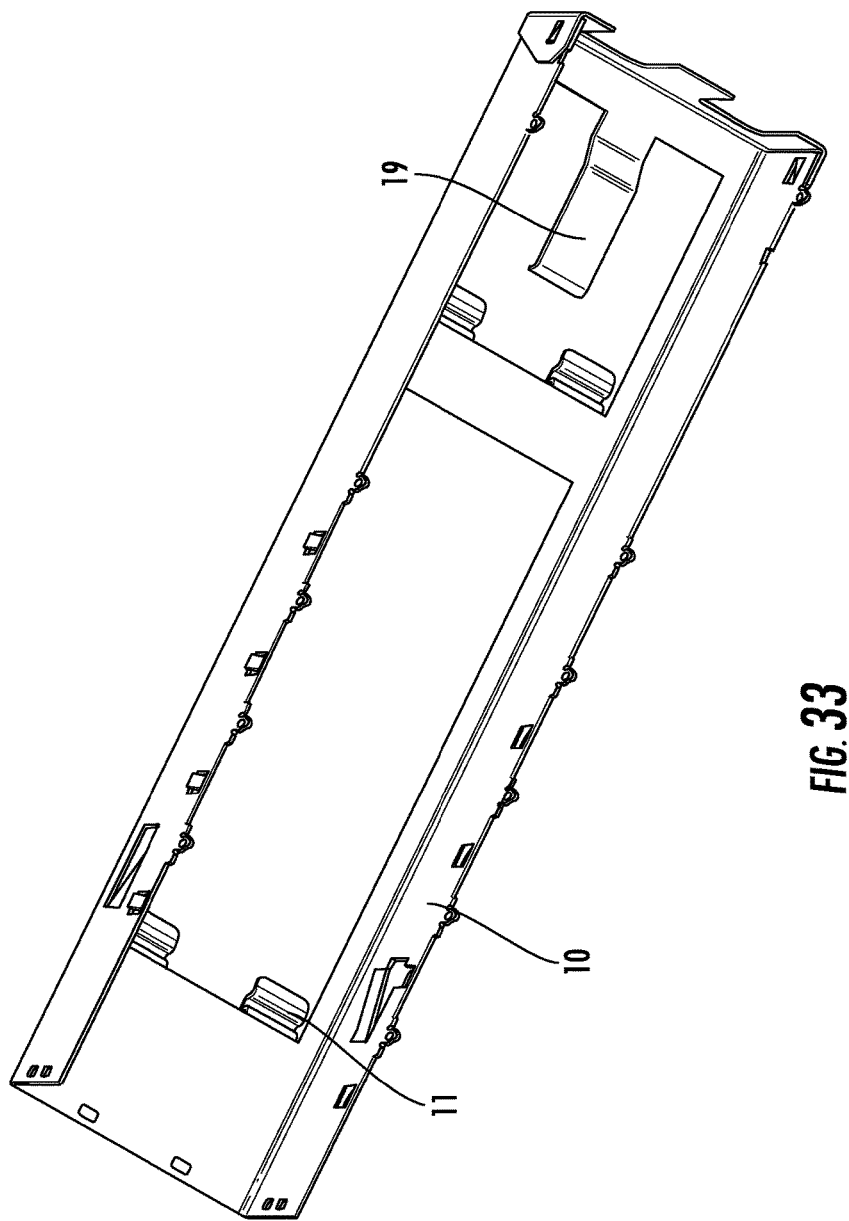
Figure 34:
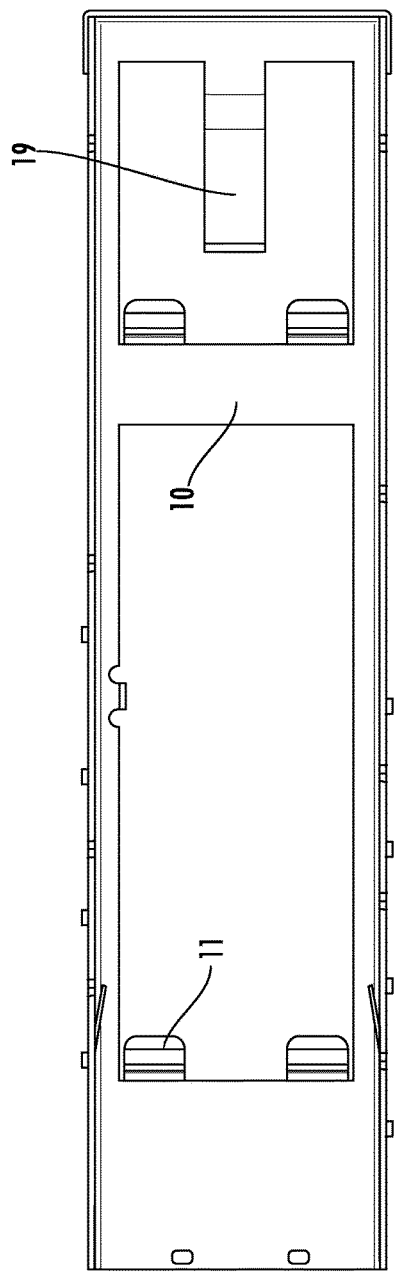
FIG. 34 is a bottom view of the cage of FIG. 29.

Each of the springs 11 can extend from the cage 10 in the same general direction. For example, in FIG. 30, each of the springs 11 extend from the cage 10 towards the bottom of the page. As shown in FIG. 32, the cage 10 can include two openings 13, and two springs 11 can extend into each of the openings 13. FIGS. 32-34 show four springs 11, but any number of springs, including, for example, two springs, can be used, and any arrangement of springs can be used, including, for example, two springs in one of the openings 13 and none in the other opening 13, or one spring in each of the openings. It is also possible to use any suitable number and arraignment of opening(s) 13. The heatsink 20 slides onto the cage 10 in a first direction so that the springs 11 engage with the pockets 41 of the heatsink 20. The springs 11 then prevent movement of the heatsink 20 in the plane defined by the opening 13 except for in a direction opposite to the first direction.

Figure 35:
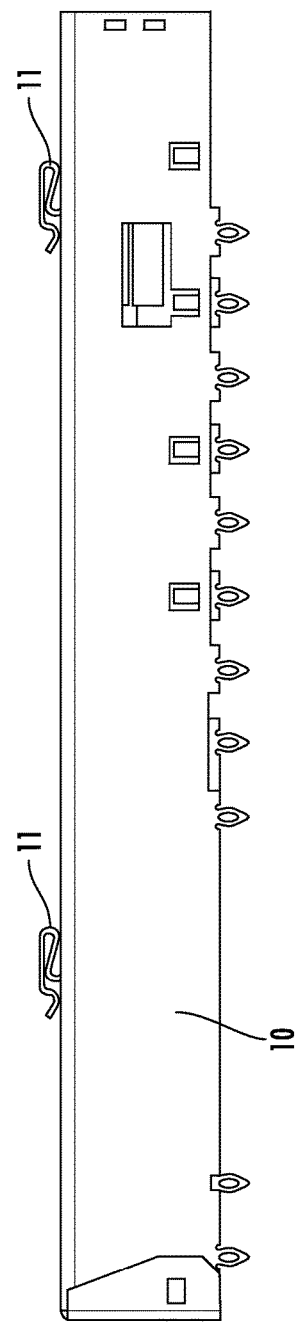
FIG. 35 is a side view of the cage of FIG. 29.
Figure 36:
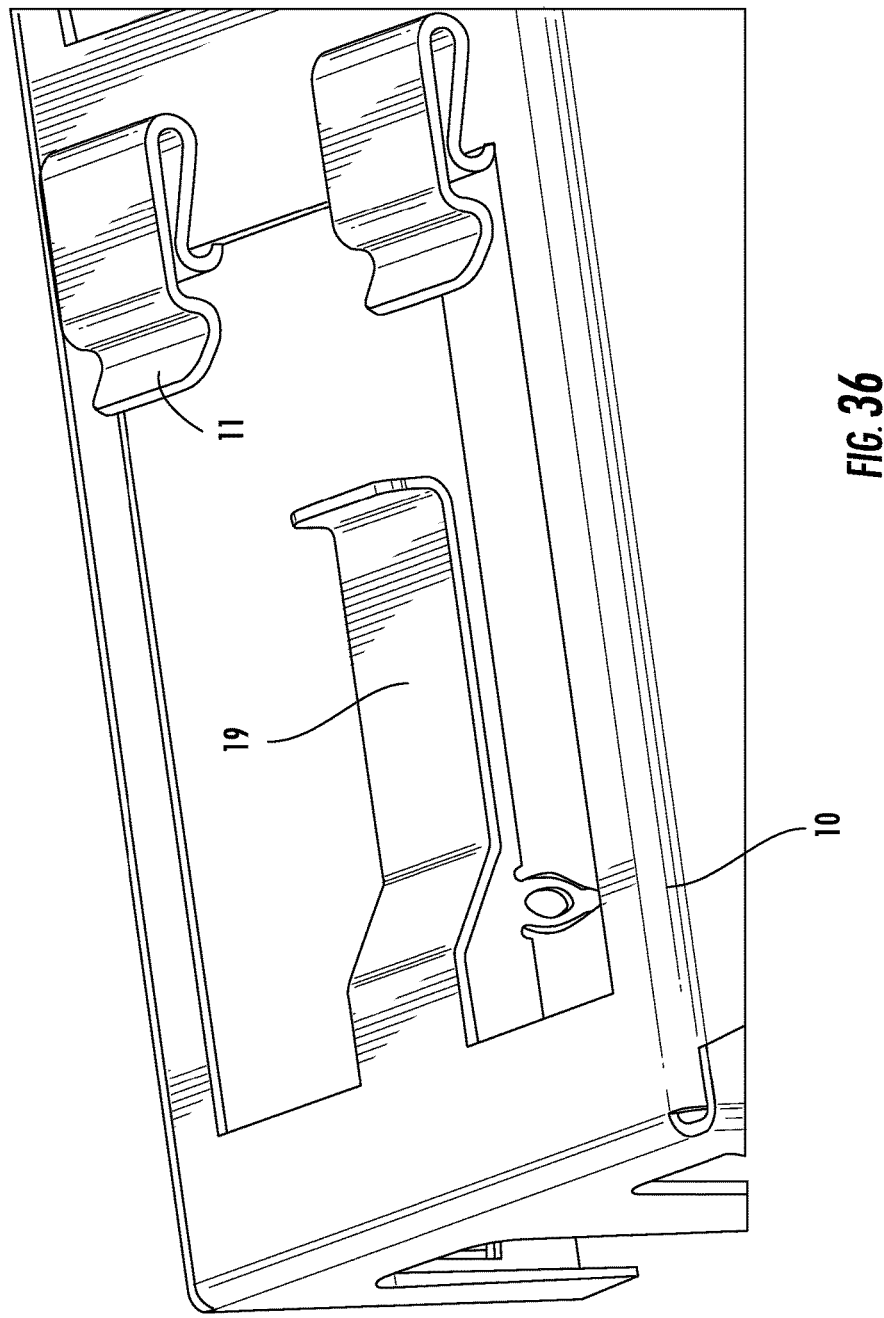
FIG. 36 is a close-up view of the locking latch of the cage of FIG. 29.
Figure 37:
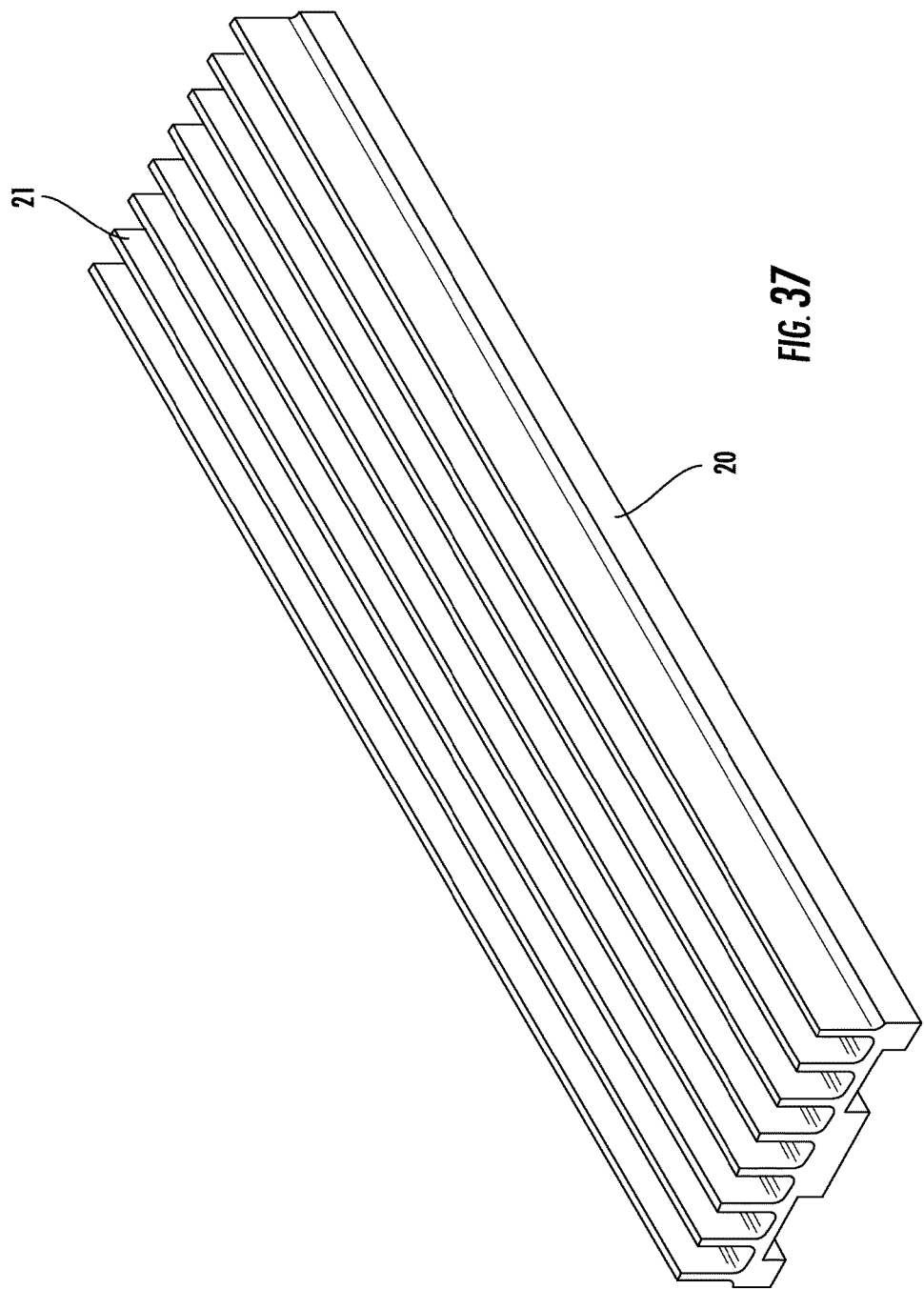
FIGS. 37 and 38 are perspective views of the heatsink of FIG. 29.

As shown in FIG. 32, the springs 11 extend into the openings 13 of the cage 10, and as shown in FIG. 35, the tips of the springs 11, at the far-end of the springs 11 opposite to the portion of the springs 11 attached to the cage 10, include engagement portions that are located within the plane defined by the openings 13, with the rest of the springs 11 being located above the plane defined by the openings 13. As shown in FIG. 35, the springs 11 can have generally an S-shape in which the springs 11 are folded back onto themselves with the engagement portions extending from the top of the S-shapes downward towards the cage 10. Other suitable shapes and arrangements are also possible, including, for example, depending on the size and location of the pockets 41 in the heatsink 30, the tips and engagement portions of the springs 11 being located above or below the plane defined by the openings 13.

Each spring 11 is inserted in a corresponding pocket 41 in the heatsink 20 to engage the heatsink 20. The springs 11 provide a downward force on the heatsink 20 so that the heatsink 20 will contact a transceiver 30 when the transceiver 30 is plugged into the cage 10. The springs 11 automatically bias the heatsink 20 against the transceiver 30. The springs 11 allow the heatsink 20 to float and to travel both up and down. The floating heatsink 20 with up and down travel can accommodate transceivers of different heights. The heatsink 20 does not need a spring or a strap that exerts a force on the top, side, or rear surfaces of the heatsink 20. The springs 11 on the cage 10 exert a downward force on the pockets 41 within the heatsink 20. As shown in FIG. 56, the cage 10 can include springs 18 on the bottom that push the floating heatsink 20 up towards the top of the cage 10. The springs 18 on the bottom can have a similar spring force over a similar deflection range as the springs 11 on the top, which allows the transceiver PCB to align with the opening of the electrical connector 60 and which reduces asymmetric loading forces of the transceiver PCB on the cage-connector contacts.

Although the cage 10 in FIGS. 32-36 is preferably rectangular, the cage could have any suitable shape. Instead of the EON compliant pins, the cage 10 could have different mounting structures. For example, the cage 10 can include press-fit pins that can be inserted into holes in a PCB or can include through-hole pins or SMT tabs that can be soldered to a mounting structure such as a PCB.

Figure 38:
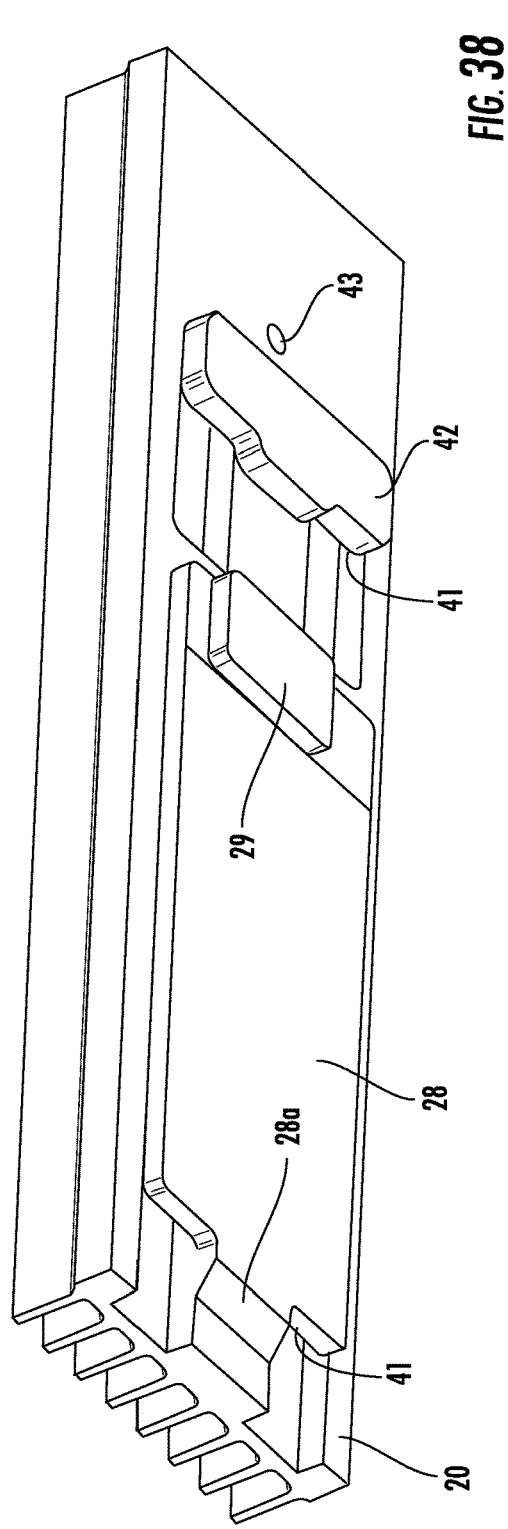
Figure 39:
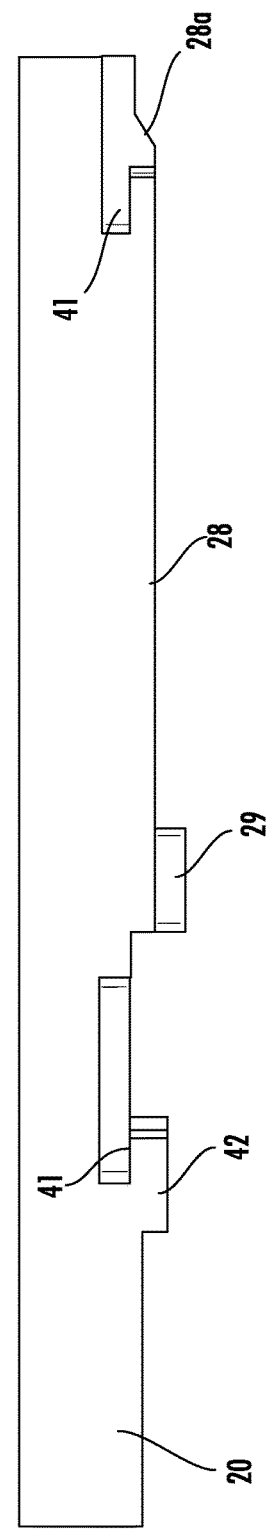
FIG. 39 is a side view of the heatsink of FIG. 29.
Figure 44:
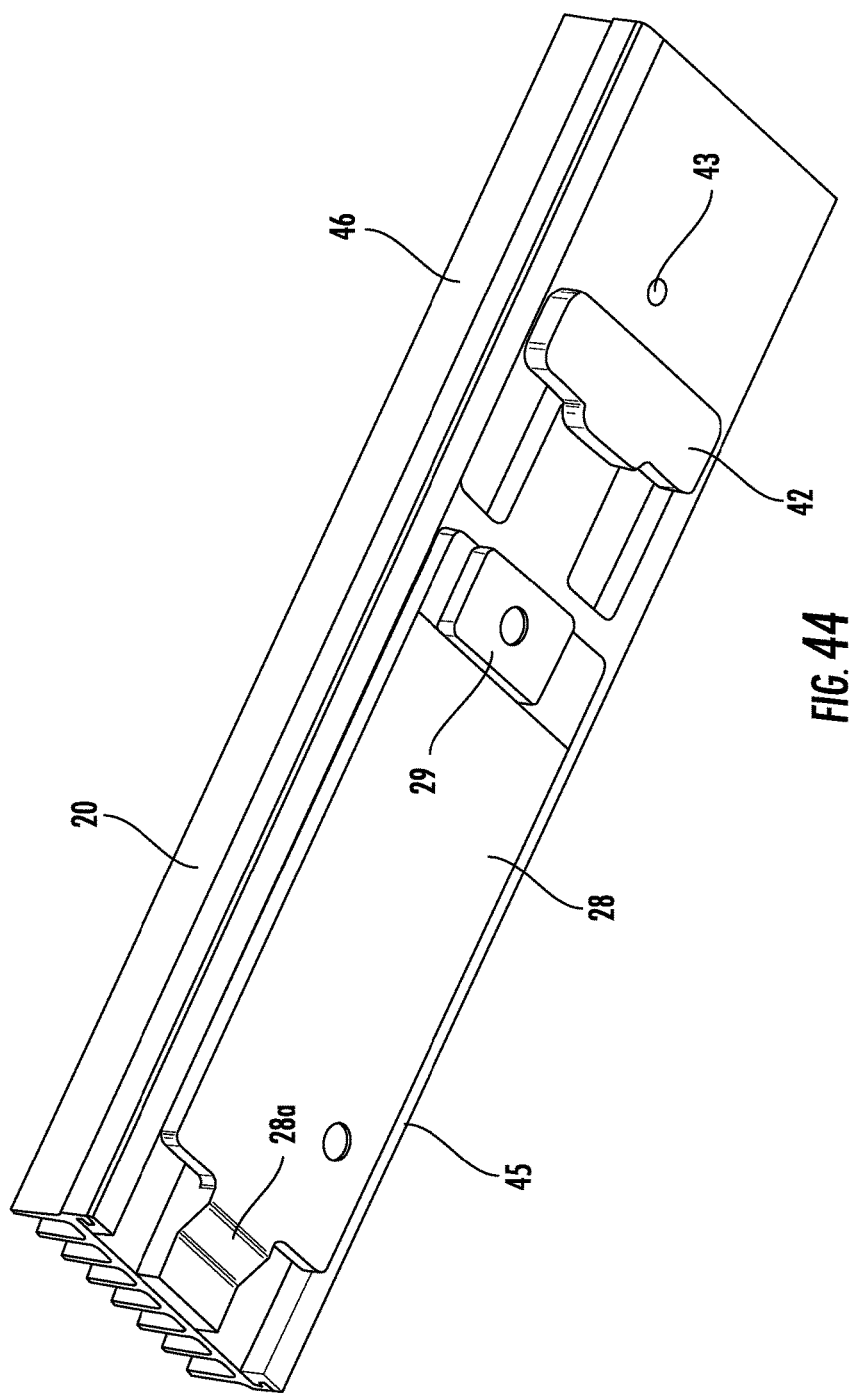

FIGS. 37-40 show a heatsink 20 according to a second preferred embodiment of the present invention. The heatsink 20 includes pockets 41 that receive the springs 11 on the cage 10. Any number of pockets 41 can be used, including, for example, two pockets. The number of pockets 41 in the heatsink 20 preferably corresponds to the number of springs 11 on the cage 10. The pockets 41 can each extend in the same general direction that is opposite to the direction that the springs 11 extend to allow the heatsink 20 to slide with respect to the cage 10. The pocket(s) 41 can be open with hole(s) in the heatsink 20 over the pockets 41 as shown in FIGS. 52-55, or the pocket(s) 41 can be closed with no hole(s) in the heatsink 20 over the pockets 41 as shown in FIGS. 38 and 44. The hole(s) on the top of heatsink 20 allow the heatsink 20 to be manufactured as a single component by extrusion and then with secondary machining to create the spring contact areas of the pockets 41.

The heatsink 20 includes a block 42 that extends into one of the openings 13 of the cage 10 when the heatsink 20 is attached to the cage 10 and that engages with the retention latch 19 of the cage 10, which prevents the heatsink 20 from becoming unattached from the cage 10. The heatsink 20 can be releasably attached to the cage 10. For example, the heatsink 20 can include a hole 43 through which a tool can be inserted to disengage the retention latch 19 from the block 42 so that the heatsink 20 can be unattached from the cage 10. The hole 43 can have any suitable shape and can be located at any location such that the tool can disengage the retention latch 19 from the block 42. The tool can be, for example, a pin, but other suitable tools could also be used. The hole 43 is optional, but without the hole 43, the heatsink 20 cannot easily be unattached from the cage 10 without damaging the cage 10. As shown in FIG. 59-61, the hole 43 can be offset in a similar manner as the retention latch 19 of FIG. 57.

Figure 58:
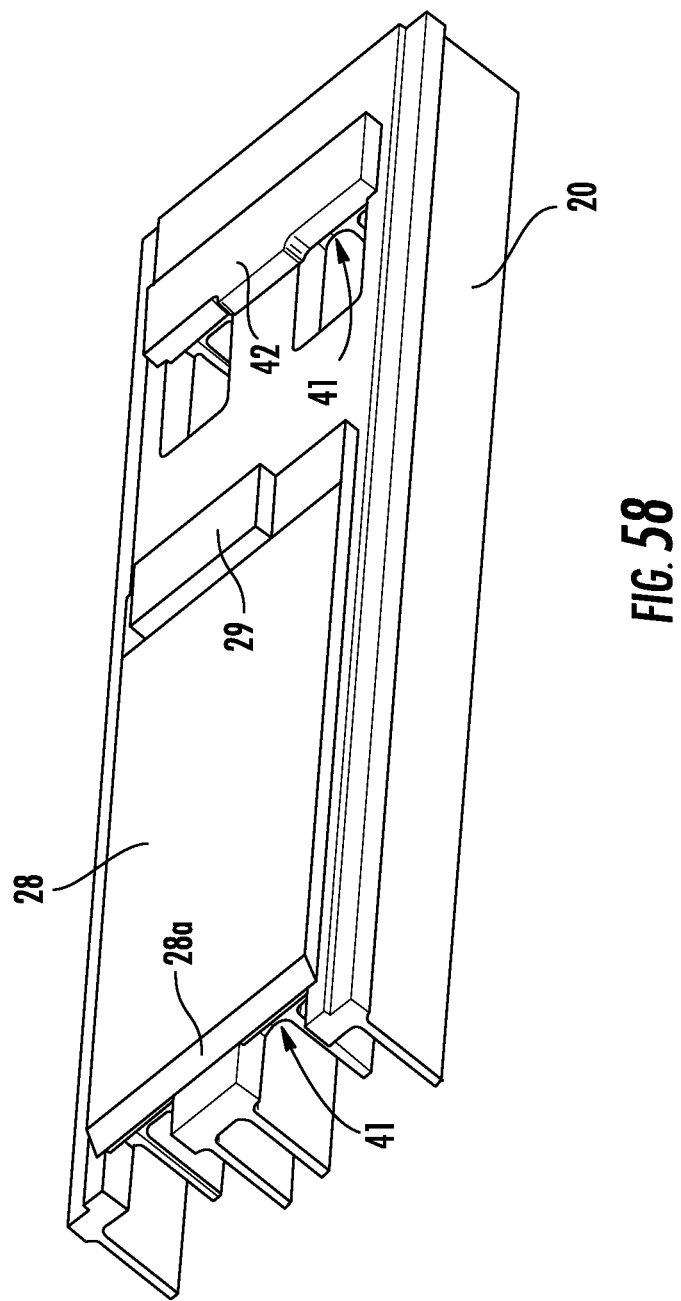
FIG. 58 is perspective view of the bottom of the heatsink of FIG. 57.

FIG. 58 shows the bottom of a heatsink 20 that is suitable for use with the cage 10 of FIG. 57. FIG. 69 shows that the retention latch 19 engages with the insertion key 29 of the heatsink 20, while FIG. 31 shows that the retention latch 19 engages with the block 42 of the heatsink 20. The insertion key 29 of FIG. 58 can be offset in a similar manner as the retention latch 19 of FIG. 57.

Figure 40:
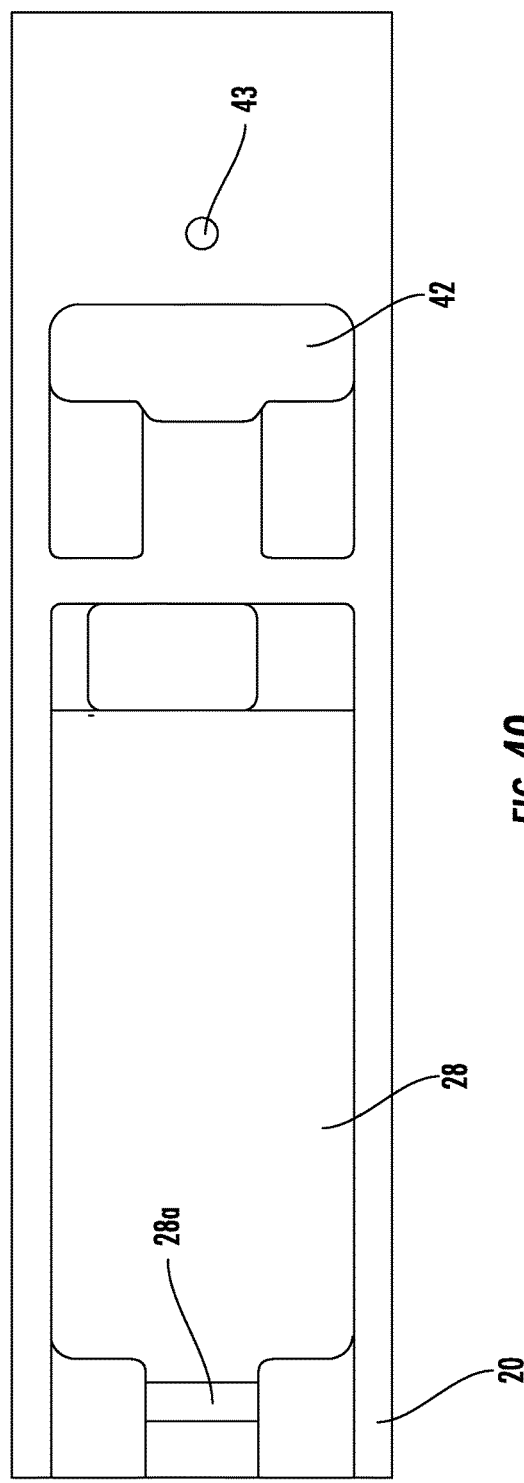
FIG. 40 is a bottom view of the heatsink of FIG. 29.

The heatsink 20 includes a protrusion 28 that extends from the body of the heatsink 20 and into the opening 13 when the heatsink 20 is attached to the cage 10. The protrusion 28 extends into the opening 13 to contact the transceiver 30 and other components positioned inside the first, second and third walls of the cage 10 or just the transceiver 30. As seen by comparing FIGS. 32 and 38, the outline of the protrusion 28 can match the outline of the opening 13 including the springs 11. It is possible that the outlines of the protrusion 28 and the opening 13 do not match, but matching allows for the protrusion 28 with the largest area, which provides the most heat conduction. The outline can define any shape. As shown in FIG. 40, the protrusion 28 defines, in plan outline view, two superimposed quadrilaterals, i.e., a rectangular perimeter with a square perimeter. The outline of the protrusion 28 can maximize surface area contact between a transceiver 30 or other connector inserted into the cage 10, and can provide a keying feature to align the heatsink 20 and the opening 13 in the cage 10. Outlines or perimeters other than a rectangular shape can be used.

The protrusion 28 can include an insertion key 29 and can be structured so that only certain types of transceivers can be fully inserted into the cage 10. For example, as shown in FIG. 40, the insertion key 29 can be offset to one side in a direction perpendicular or substantially perpendicular to the transceiver insertion direction. Offsetting the insertion key 29 allows only QSFP and QSFP double density transceivers to be inserted into the cage 10.

With the cage 10 of the second preferred embodiment of the present invention, it is possible to use a heat pipe 70 as shown in FIGS. 59-61 or the zippered structure 72 and the base 73 as shown in FIGS. 64 and 65 instead of the heatsink 20. As shown in FIG. 60, the base 70, 73 can include pockets 41 that engage with the springs 11 on the cage 10 of the second preferred embodiment.

In the second preferred embodiment of the present invention, the assembly of the cage 10 and heatsink 20 is similar to the assembly of the cage 10 and heatsink 20 of the first preferred embodiment shown in FIGS. 12-23 in that the heatsink 20 is placed on top of the cage 10 and slid forward to attach the heatsink 20 to the cage 10. The retention latch 19 engages with the block 42 on the underside of the heatsink 20. If the heatsink 20 includes hole 43, then the heatsink 20 can be removed from the cage 10 by inserting a tool into the hole 43 on the top of the heatsink 20 to deflect the retention latch 19 and sliding the heatsink 20 rearward.

Figure 41:
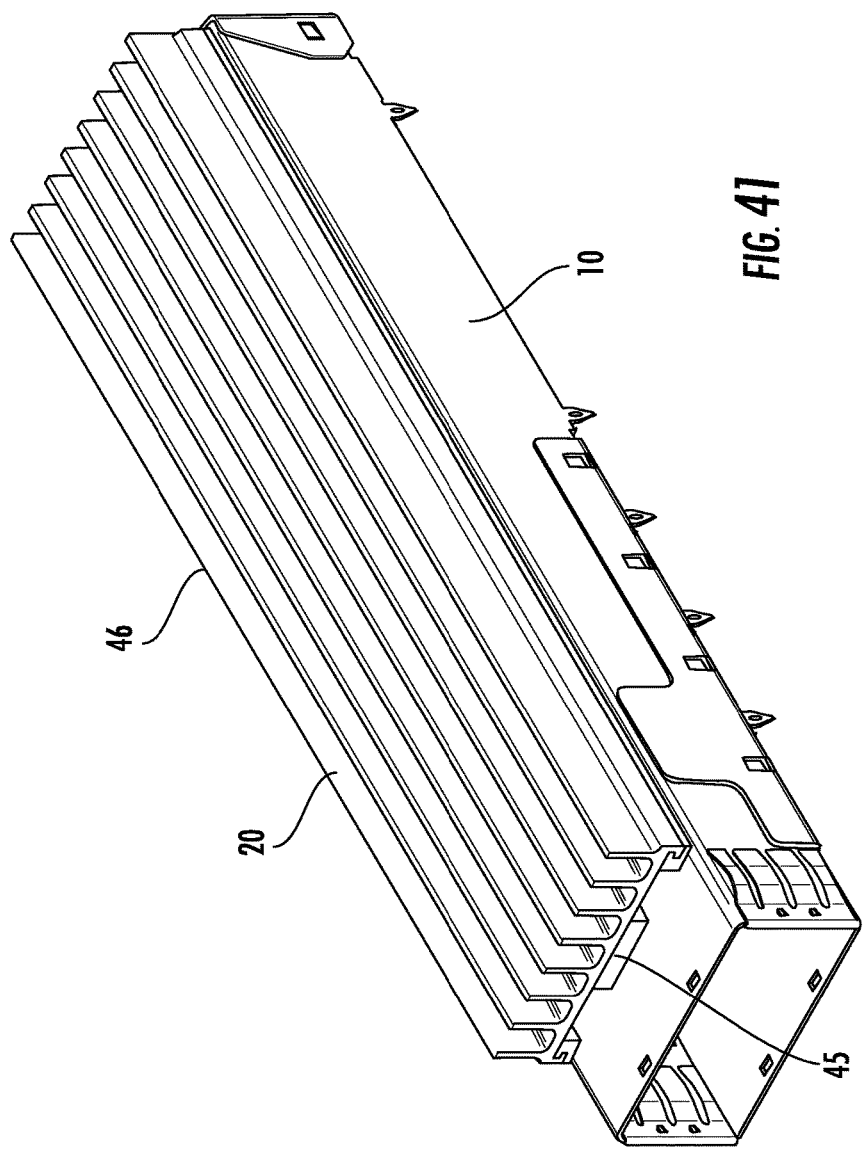
FIG. 41 shows a cage of FIG. 29 with an alternative heatsink.
Figure 42:
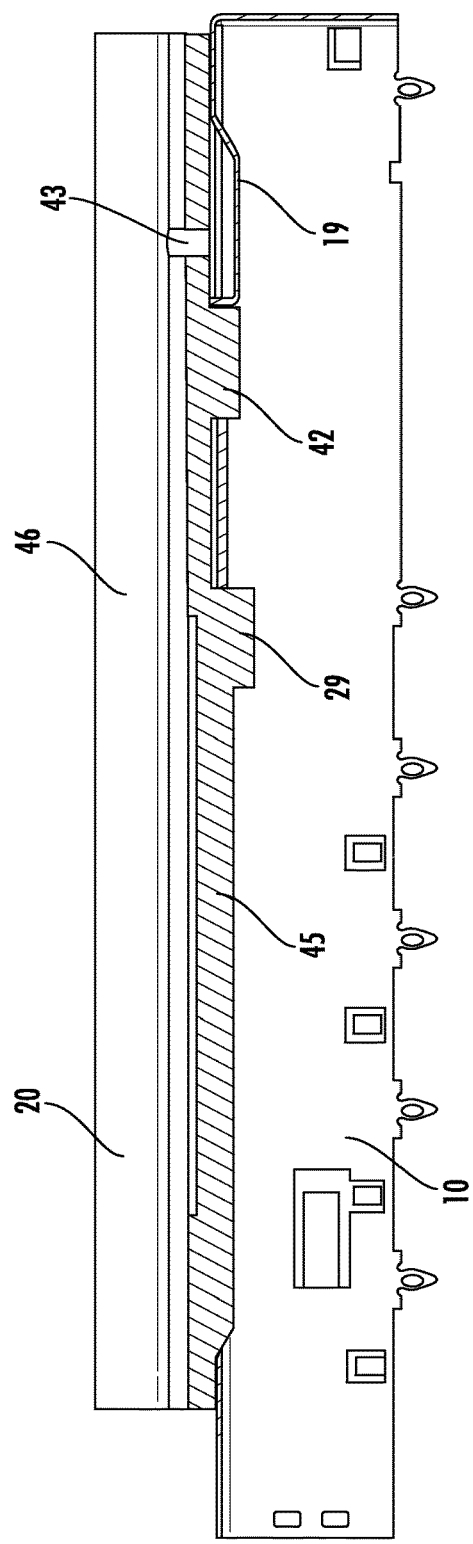
FIG. 42 is a sectional side view of the cage of FIG. 29 with the alternative heatsink.

FIGS. 41-48 show an alternative heatsink 20 that can be used with the cage 10 shown in FIGS. 32-36. The alternative heatsink 20 is similar to the heatsink 20 shown in FIGS. 37-40, except that the heatsink 20 includes a heat spreader 45 and a heat radiator 46 that can be connected to each other. The heat spreader 45 includes grooves 47 that engage with arms 48 on the heat radiator 46. FIGS. 41 and 42 shows the alternative heatsink 20 with the heat spreader 45 and the heat radiator 46 connected to each other, and the alternative heatsink 20 is connected to the cage 10 by the springs 11 (not shown in FIGS. 41 and 42) and the retention latch 19 (shown in the sectional view of FIG. 42).

Figure 43:
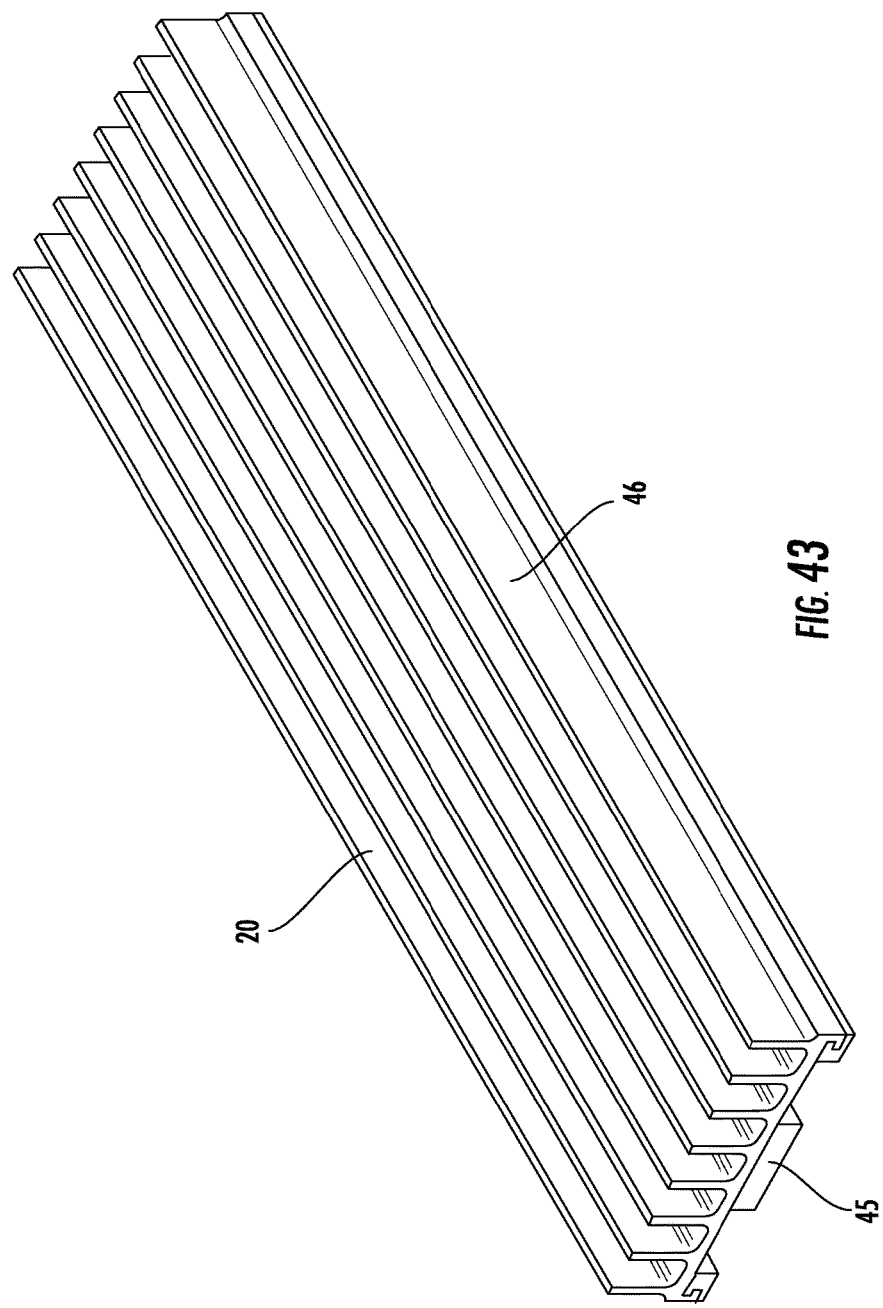
FIGS. 43 and 44 are perspective views of the alternative heatsink of FIG. 41.

FIGS. 43 and 44 show the alternative heatsink 20 with the heat spreader and the heat radiator connected to each other. As with the heatsink shown in FIGS. 37 and 38, the alternative heatsink includes a block that engages with the retention latch on the cage, a hole that can be used to disengage the retention latch from the block, and a protrusion with a ramp.

Figure 45:
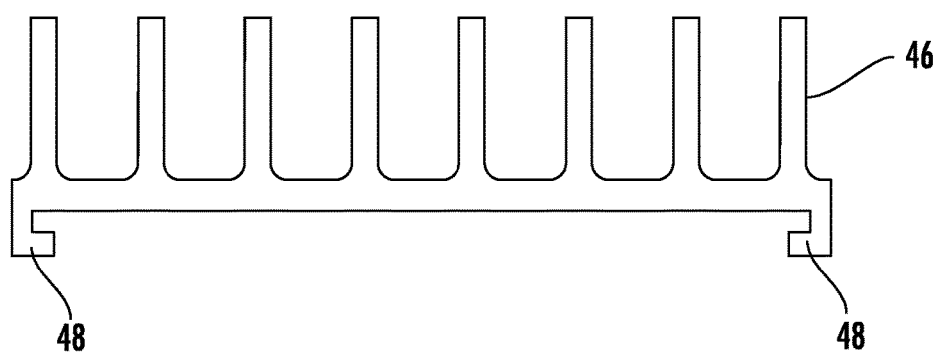
FIG. 45 is a front view of the heat radiator of the alternative heatsink.

FIG. 45 shows a front view of the heat radiator. The heat radiator includes arms that engage with corresponding grooves in the heat spreader and includes fins that extend away from the heat spreader. The heat radiator can include aluminum or other suitable materials.

Figure 46:
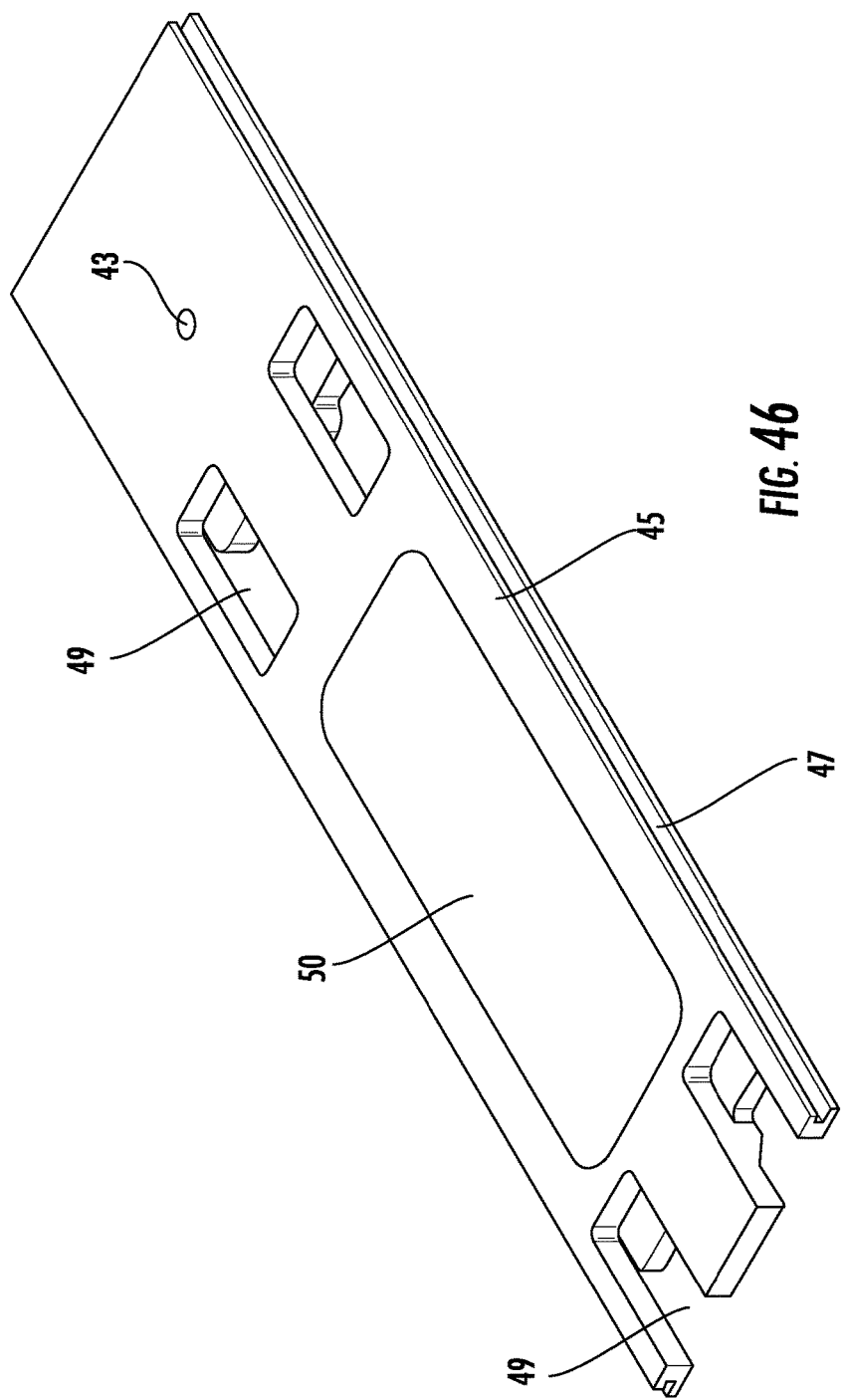
FIGS. 46-48 are perspective views of the heat spreader of the alternative heatsink.
Figure 47:
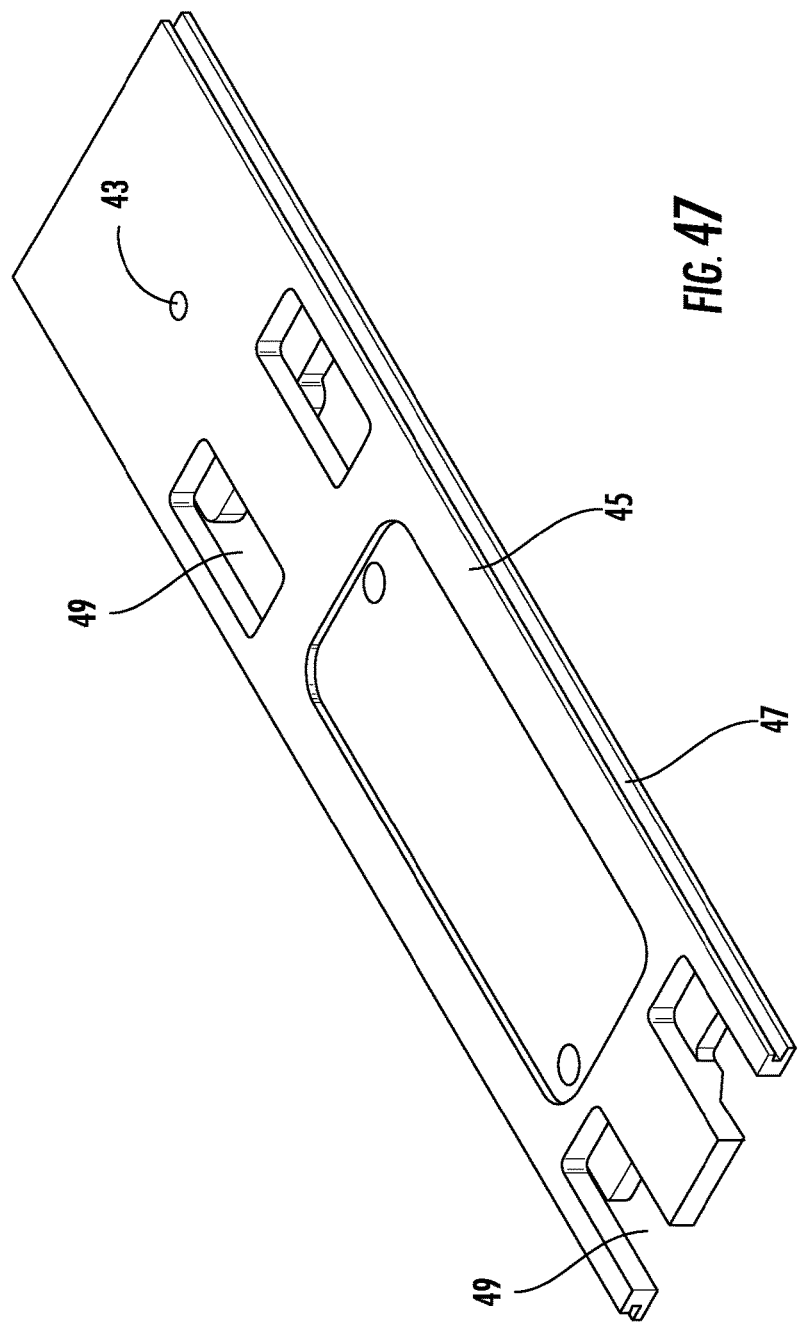
Figure 48:
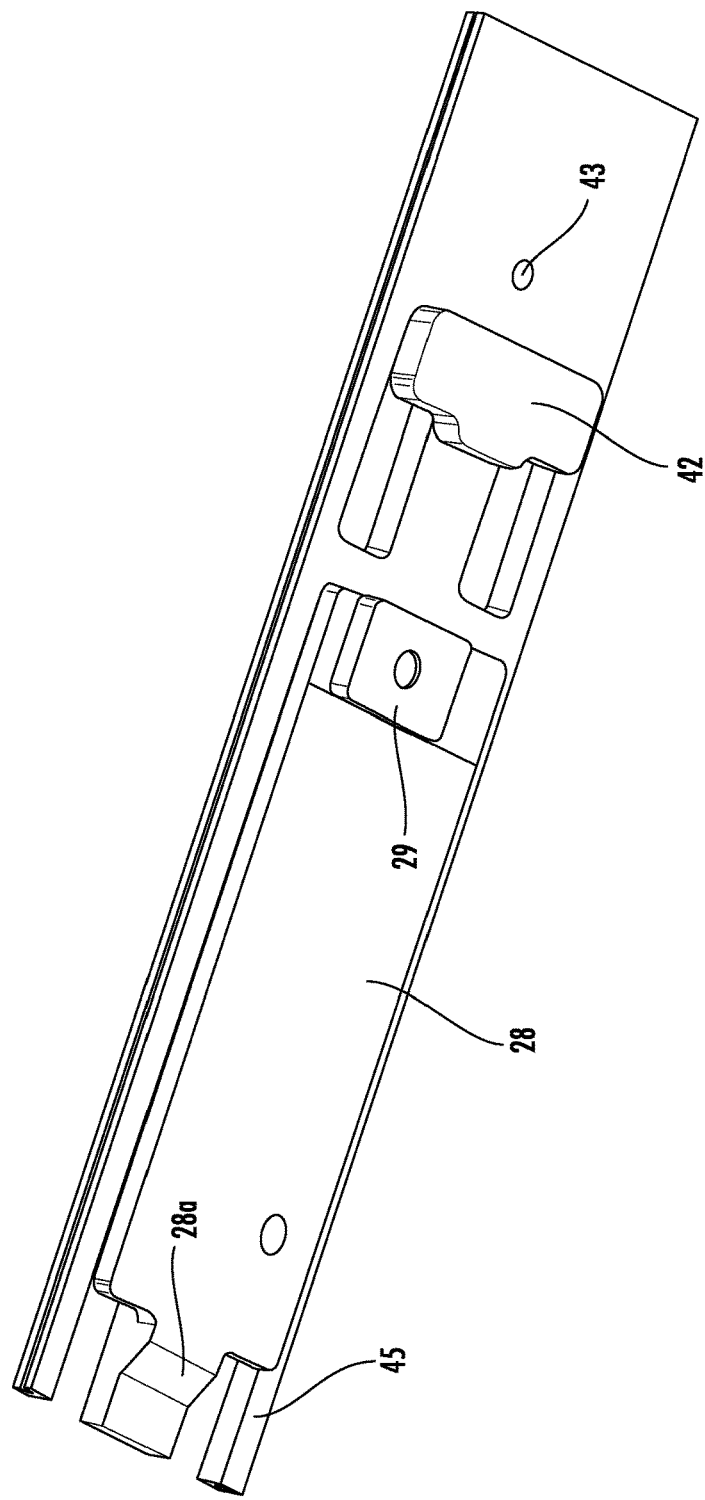
Figure 49:
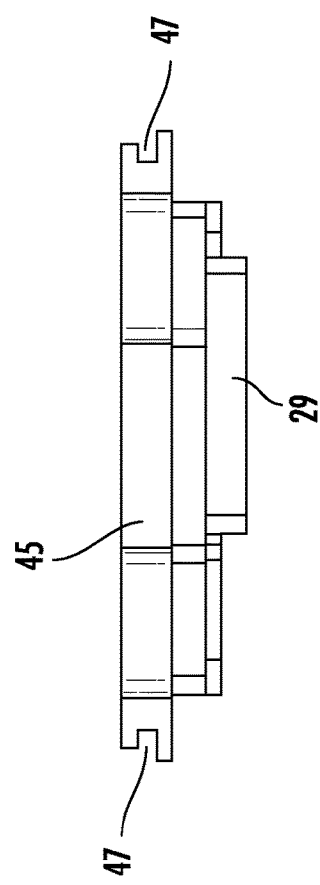
FIG. 49 is a front view of the heat spreader of the alternative heatsink.
Figure 50:
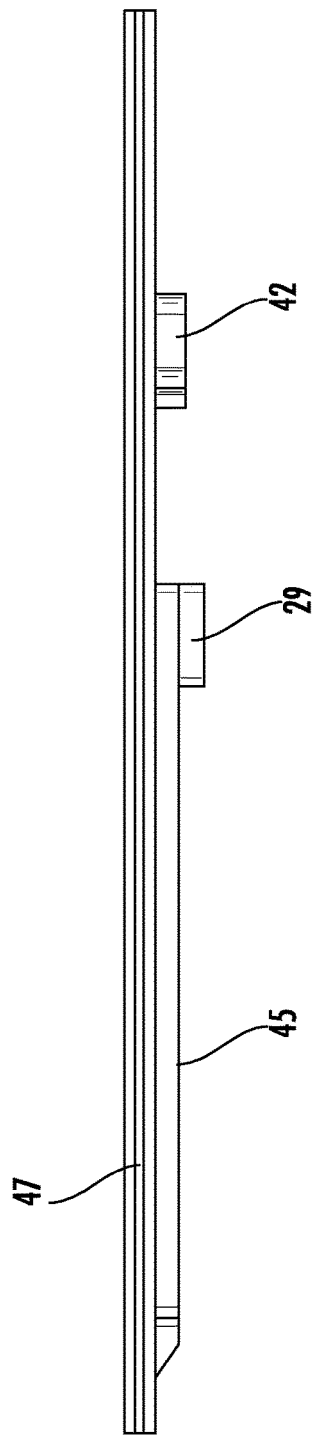
FIG. 50 is a side view of the heat spreader of the alternative heatsink.
Figure 51:
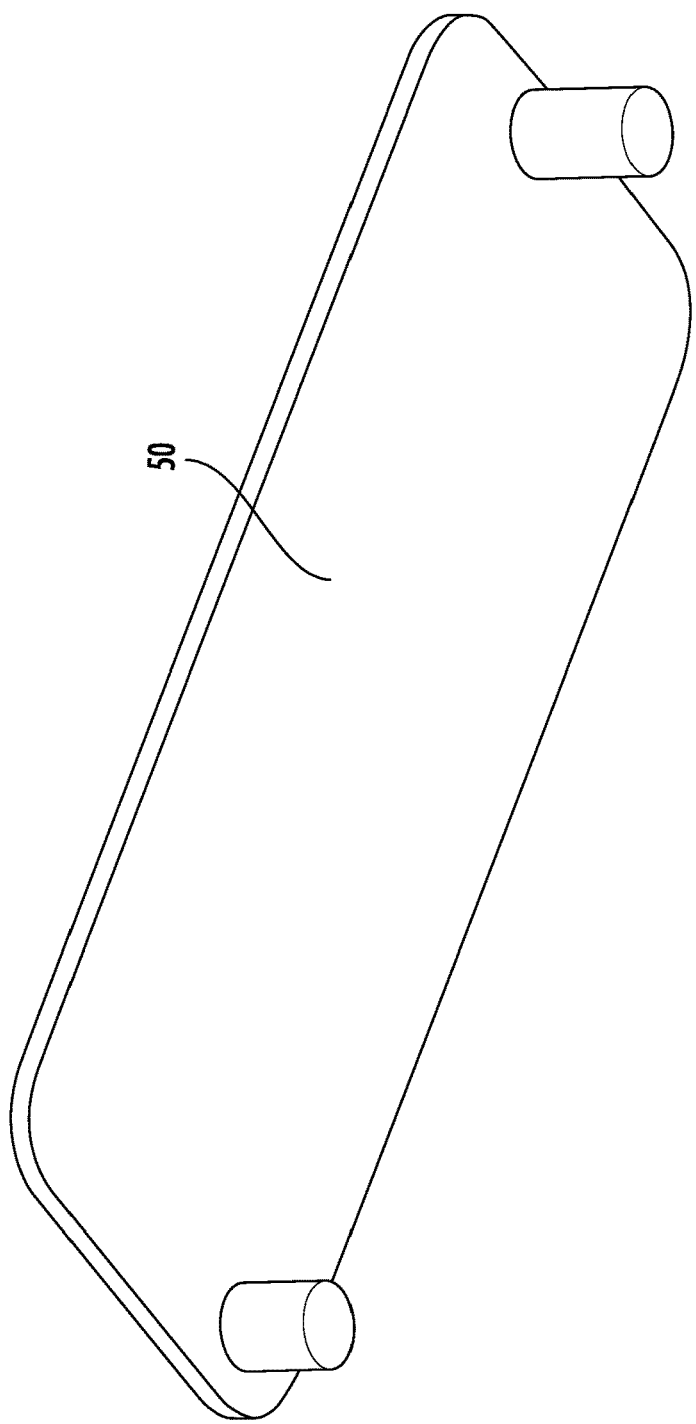
FIG. 51 is a perspective view of the plug of the heat spreader.

FIGS. 46-50 show the heat spreader 45. The heat spreader 45 includes grooves 47 that engage with the arms 48 of the heat radiator 46. The heat spreader 45 and heat radiator 46 can be attached in any suitable manner, including, for example, riveted, screwed, fixed with a thermally conductive adhesive, soldered, thermally bonded using an exothermic reactive foil such as Indium Corporation's Nanofoil, vibration welded, etc. The bottom of the heat spreader 45 contacts the transceiver or connector when the transceiver or connector is plugged into the cage 10. The heat spreader 45 can be made of copper or other suitable thermally conductive material. The heat spreader 45 can also include openings 49 that define the pockets 41 when the heat spreader 45 is connected to the heat radiator 46. As shown in FIGS. 46 and 47, the heat spreader 45 can also include a plug 50. FIG. 46 shows the heat spreader 45 with the plug 50, and FIG. 47 shows the heat spreader 45 without the plug 50. The plug 50 is shown in FIG. 51. The plug 50 can be a thermally conductive substance that bonds the heat spreader 45 to the heat radiator 46. For example, the plug 50 could be a thermally conductive silicone adhesive or could be solder.

The plug 50 preferably eliminates any voids between the heat spreader 45 and the heat radiator 46 that would reduce the thermal resistance.

FIGS. 32-36 show the cage 10 of the second preferred embodiment of the present invention. The cage 10 may include first and second spaced apart walls and a third wall that spans the first and second walls. The first, second, or third wall may include or define one or more openings, and two or more springs 11 can each extend into the opening(s). The cage 10 may further include a fourth rear wall perpendicular to the third wall, a fifth bottom wall parallel to the third wall, and an opening 14 configured to receive a module, transceiver, or some other electrical or optical interconnect. The first wall can include a first edge and an opposed second edge. The second wall can include a third edge and an opposed fourth edge, and the third wall can include a fifth edge and an opposed sixth edge. The first wall and the second wall of the first and second spaced apart walls may be parallel or substantially parallel to each other. The fifth edge of the third wall may be attached to the first edge of the first wall and the opposed sixth edge of the third wall may be attached to the third edge of the second wall. The opposed second edge of the first wall and the opposed fourth edge of the second wall are configured to be positioned adjacent to a mounting substrate, such as a PCB. The opposed second and fourth edges of the first and second walls further define EON compliant pins, but other board or substrate mounting tails, such as press fit or SMT tails, could also be used. The two or more springs 11 may each extend generally into the opening 13 in plane with the first, second or third wall, in a direction away from the third or top wall and towards the opposed second edge of the first wall or the opposed fourth edge of the second wall, or in a direction away from fins 21 of the heatsink 20.

It should be understood that the foregoing description is only illustrative of the present invention. Various alternatives and modifications can be devised by those skilled in the art without departing from the present invention. Accordingly, the present invention is intended to embrace all such alternatives, modifications, and variances that fall within the scope of the appended claims.

What is claimed is:

1. A cage comprising:
   a first wall that includes a first edge and a second edge opposed to the first edge;
   a second wall that is spaced apart from the first wall and that includes a third edge and a fourth edge opposed to the third edge; and
   a third wall that spans the first and second walls and that includes:
      an opening;
      a fifth edge connected to the first edge of the first wall;
      a sixth edge opposed to the fifth edge and connected to the third edge of the second wall;
      a seventh edge that extends in a direction perpendicular to a transceiver-insertion direction; and
      two spring arms that each extend from the seventh edge into the opening and that have deflection ranges in a direction perpendicular or substantially perpendicular to the third wall; wherein
   the second edge of the first wall and the fourth edge of the second wall are configured to be positioned adjacent to a mounting substrate when the cage is mounted to the mounting substrate.

2. The cage of claim 1, wherein the two spring arms are cantilevered spring arms.

3. A cage assembly comprising;
   a heatsink; and
   the cage of claim 1; wherein
   the two spring arms and the opening receive a portion of the heatsink.

4. The cage assembly of claim 3, wherein:
   the heatsink includes a post; and
   one of the two spring arms includes a slot that receives the post.

5. The cage of claim 1, wherein at least one of the two spring arms includes a slot.

6. The cage assembly of claim 3, wherein the heatsink includes two spaced apart pockets that each engage with a corresponding one of the two spring arms.

7. The cage assembly of claim 3, wherein a protrusion defined by the heatsink floats within the cage.

8. The cage assembly of claim 3, wherein the heatsink is movable up and down within the cage, in directions toward and away from the third wall.

9. The cage of claim 1, wherein the first wall and the second wall of the first and second spaced apart walls are parallel or substantially parallel to each other.

10. The cage of claim 1, wherein the cage further includes an additional opening and two additional spring arms that extend into the additional opening.

11. The cage of claim 1, wherein the third wall and the two spring arms define a monolithic body.

12. A heatsink comprising:
    a heatsink body including a first surface and a protrusion that extends from the first surface of the heatsink body;
    a pair of spring-arm receivers positioned on the first surface of the heatsink body; and
    a pair of holes in the heatsink body that are spaced apart and that are each arranged over a corresponding one of the pair of spring-arm receivers; wherein
    each of the pair of spring-arm receivers is configured to engage with a corresponding one of two spring arms of a cage when the heatsink is attached to the cage.

13. The heatsink of claim 12, further comprising an insertion key that is defined by the first surface of the heatsink body.

14. The heatsink of claim 12, further comprising a retention key that is defined by the first surface of the heatsink body, wherein the retention key engages with the cage to prevent the heatsink from being unattached from the cage after the heatsink has been attached to the cage.

15. The heatsink of claim 12, wherein the heatsink further includes an additional pair of spring-arm receivers.

16. A cage assembly comprising:
    a cage including:
       a first wall that includes a first edge and a second edge opposed to the first edge;
       a second wall that is spaced apart from the first wall and that includes a third edge and a fourth edge opposed to the third edge; and
       a third wall that spans the first and second walls and that includes:
          an opening;
          a fifth edge connected to the first edge of the first wall;
          a sixth edge opposed to the fifth edge and connected to the third edge of the second wall;
          a seventh edge that extends in a direction perpendicular to a transceiver-insertion direction; and
          two spring arms that each extend from the seventh edge into the opening; wherein the second edge of the first wall and the fourth edge of the second wall are configured to be positioned adjacent to a mounting substrate when the cage is mounted to the mounting substrate; and a heatsink including:
  a heatsink body including a first surface and a protrusion that extends from the first surface of the heatsink body; and
  a pair of spring-arm receivers positioned on the first surface of the heatsink body; wherein each of the pair of spring-arm receivers is configured to engage with a corresponding one of the two spring arms of the cage when the heatsink is attached to the cage; and each of the two spring arms provide a downward force on the heatsink.

17. A transceiver assembly comprising:
the cage assembly of claim 16; and
a transceiver plugged into the cage such that the transceiver engages the protrusion.

18. The cage assembly of claim 16, wherein:
the heat sink body further includes a second surface, opposite the first surface; and
the cage and the heatsink are devoid of any spring that exerts a force on the second surface of the heatsink body.

19. The cage assembly of claim 16, wherein the third wall of the cage does not flex when a transceiver is positioned between the first and second spaced apart walls of the cage.

20. The cage assembly of claim 16, wherein:
the cage further includes two additional spring arms; and
the heatsink further includes an additional pair of spring-arm receivers.

21. The cage assembly of claim 16, wherein:
the two spring arms extend from the third wall in the transceiver-insertion direction; and
the pair of spring-arm receivers is a pair of pockets that each extend in the first transceiver-insertion direction.

22. A cage comprising: first and second spaced apart walls; and a third wall that spans the first and second walls; wherein the third wall includes an opening and a spring arm that extends into the opening; and the spring arm is folded back on itself to receive a heatsink.

23. The cage of claim 22, wherein the spring arm has a deflection range in a direction perpendicular or substantially perpendicular to the third wall.

\* \* \* \* \*